(12) United States Patent
Otsuka et al.

(10) Patent No.: US 7,631,422 B2
(45) Date of Patent: Dec. 15, 2009

(54) METHOD OF MANUFACTURING WIRING SUBSTRATE HAVING TERMINATED BUSES

(75) Inventors: Kanji Otsuka, Kohan 2-1074-38, Higashiyamato-shi, Tokyo (JP); Tamotsu Usami, Nishi-machi 2-38-4, Kokubunji-shi, Tokyo (JP)

(73) Assignees: Kanji Otsuka, Tokyo (JP); Tamotsu Usami, Tokyo (JP); Rohm Co., Ltd., Kyoto (JP); Oki Semiconductor Co., Ltd., Tokyo (JP); Sanyo Electric Co., Ltd., Moriguchi-shi (JP); Sony Corporation, Tokyo (JP); Kabushiki Kaisha Toshiba, Tokyo (JP); NEC Corporation, Tokyo (JP); Sharp Kabushiki Kaisha, Osaka (JP); Renesas Technology Corp., Tokyo (JP); Fujitsu Microelectronics Limited, Tokyo (JP); Panasonic Corporation, Osaka (JP)

( * ) Notice: Subject to any disclaimer, the term of this patent is extended or adjusted under 35 U.S.C. 154(b) by 0 days.

(21) Appl. No.: 11/440,113

(22) Filed: May 25, 2006

(65) Prior Publication Data
US 2006/0226927 A1 Oct. 12, 2006

Related U.S. Application Data

(62) Division of application No. 10/079,464, filed on Feb. 22, 2002, now Pat. No. 7,116,184.

(30) Foreign Application Priority Data
Mar. 1, 2001 (JP) ............................... 2001-56357

(51) Int. Cl.
 *H05K 3/28* (2006.01)
 *H05K 3/30* (2006.01)
 *H05K 3/32* (2006.01)

(52) U.S. Cl. .................. 29/841; 29/832; 333/22 R; 338/262

(58) Field of Classification Search ............ 29/830, 29/610.1, 613, 619, 832, 831, 842, 841, 848, 29/855, 858; 333/22 R; 338/262, 263, 264, 338/265, 266, 257, 277, 269, 307–309
See application file for complete search history.

(56) References Cited

U.S. PATENT DOCUMENTS 3,669,650 A * 6/1972 Cocca ...................... 75/354

(Continued)

FOREIGN PATENT DOCUMENTS

JP 53-082147 A 7/1978

(Continued)

OTHER PUBLICATIONS

Dielectric Constant Reference Guide, http://www.clippercontrols.com/info/dielectric_constants.html, pp. 20 and 50.*

(Continued)

*Primary Examiner*—A. Dexter Tugbang
*Assistant Examiner*—Livius R Cazan
(74) *Attorney, Agent, or Firm*—Westerman, Hattori, Daniels & Adrian, LLP

(57) ABSTRACT

A terminal resistor is provided at the end of a bus formed on a wiring substrate. An insulator having a large dielectric loss angle is provided in the vicinity of the terminal resistor to absorb high frequency electromagnetic waves in the vicinity. This arrangement permits successful transmission of digital signals in the GHz region using a conventional terminal resistor.

1 Claim, 15 Drawing Sheets

U.S. PATENT DOCUMENTS

| | | | |
|---|---|---|---|
| 4,373,019 A | | 2/1983 | Watanabe et al. |
| 5,640,746 A | * | 6/1997 | Knecht et al. .............. 29/25.35 |
| 5,955,938 A | | 9/1999 | Fukaya |
| 6,271,678 B1 | | 8/2001 | Sochoux |
| 6,521,997 B1 | * | 2/2003 | Huang et al. ................ 257/737 |
| 6,754,950 B2 | * | 6/2004 | Furukawa et al. ............. 29/832 |
| 7,145,117 B2 | * | 12/2006 | Ristola et al. .............. 219/693 |

FOREIGN PATENT DOCUMENTS

| | | |
|---|---|---|
| JP | 60-48294 U | 4/1985 |
| JP | 05-129805 A | 5/1993 |
| JP | 5-218222 A | 8/1993 |
| JP | 5-335776 A | 12/1993 |
| JP | 07-030052 A | 1/1995 |
| JP | 10-145074 A | 5/1998 |
| JP | 2000-174505 A | 6/2000 |
| JP | 2001-016004 A | 1/2001 |

OTHER PUBLICATIONS

Lee et al., The Properties of Electrical Conduction and Photoconduction in Polyphenylene Sulfide by Uniaxial Elongation, Jun. 1998, IEEE, p. 2.*

Epoxy-Wikipedia, the free encyclopedia, http://en.wikipedia.org/wiki/Epoxy_resin, p. 4.*

Horton et al., Measurements of Dielectric Constant and Loss Tangent in Materials Having Large Dielectric Constants, IEEE Transactions On Microwave Theory and Techniques, Oct. 1968, Fig. 3.*

* cited by examiner

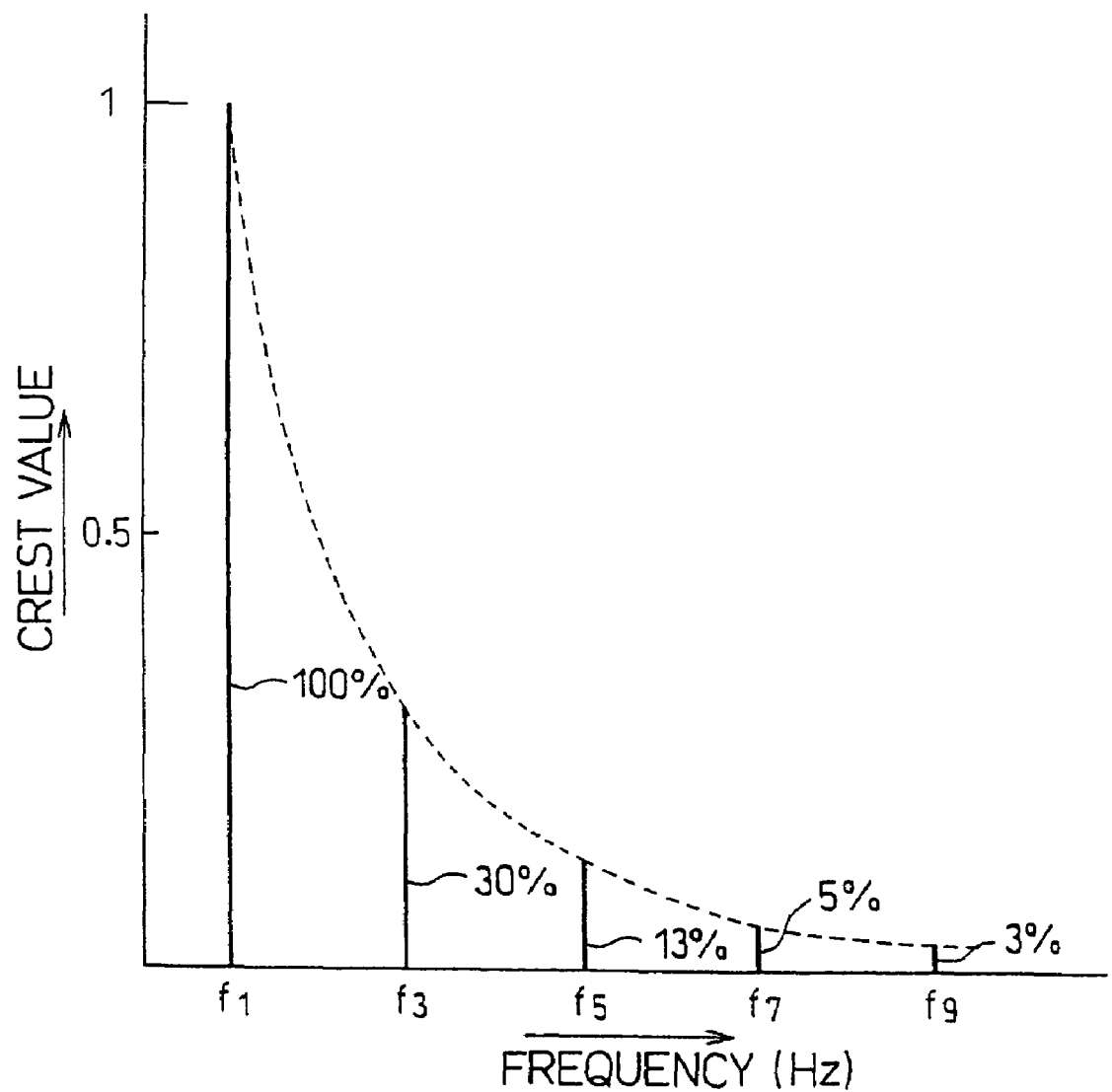

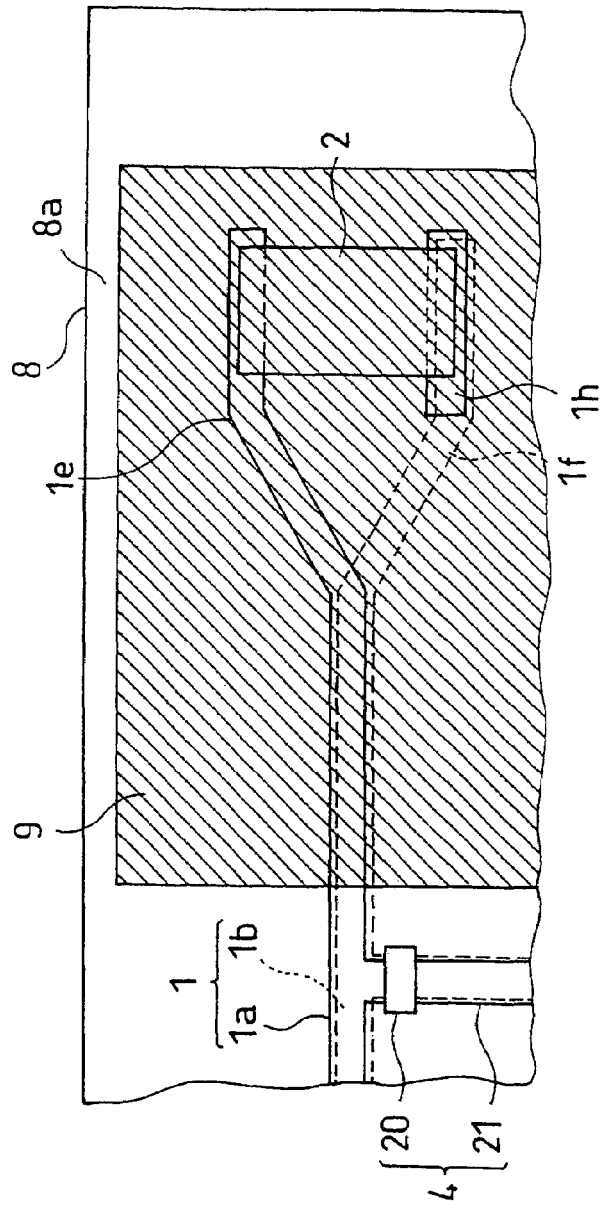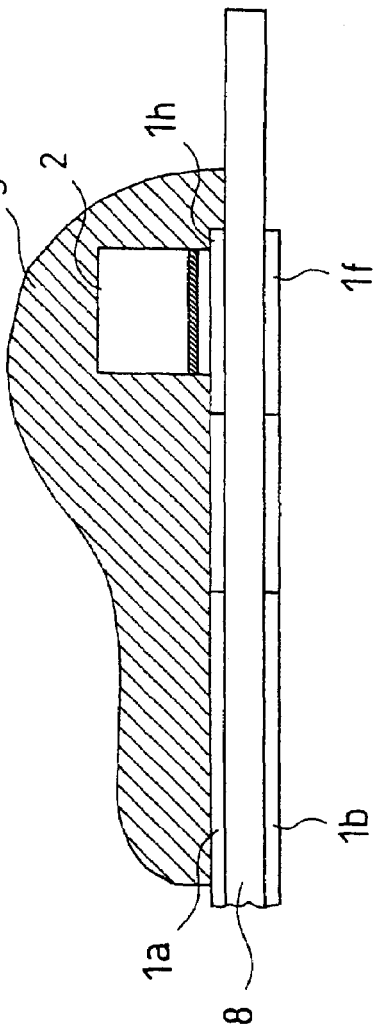

METHOD OF MANUFACTURING WIRING SUBSTRATE HAVING TERMINATED BUSES

This application is a divisional of prior application Ser. No. 10/079,464 filed Feb. 22, 2002, now U.S. Pat. No. 7,116,184, the benefit of which is claimed under 35 U.S.C. §120.

FIELD OF THE INVENTION

The invention relates to a method of terminating a bus for transmitting high frequency digital signals, a terminal resistor for terminating a bus, a wiring substrate having a terminated bus, and a method of its manufacture.

BACKGROUND OF THE INVENTION

In a digital system having a CPU and a storage device for example, pulses or digital signals are affected by the reflected waves of the signals at terminal ends of a transmission line (referred to as bus) when the frequencies of the signals are high and the bus is fairly long. The reflected waves distort the waveforms of the pulses.

For instance, a digital signal having a pulse repetition frequency of 100 MHz or above can be deformed into a stepping pulse when the transmission time of a bus exceeds one fifth of the rise time of the pulse. Such deformation of pulse will greatly affect the threshold time of the digital signal. In particular, this tendency becomes significant when the pulse repetition frequency is 200 MHz or above and the length of the bus exceeds 200 mm.

In order to suppress the influence of the reflective waves, a terminal resistor is inserted at the starting point or the terminal point, or both, of the bus so that the resistance of the terminal resistor matches the characteristic impedance of the bus, thereby suppressing the reflective energy of waves.

In recent years, CPUs, input/output (I/O) devices, and storage devices have become increasingly faster. Some of them have operating frequencies on the order of 1 GHz. Such speed up of CPUs will continue still.

Thus, in view of these high speed CPUs and devices, what is needed is a bus which can ensure transmission of a high frequency digital signal to and from these CPUs and devices.

Use of terminal resistors has been known over the last 20 years in the art of emitter coupled logic (ECL) circuit of a main frame for example, to suppress the reflection of waves. This approach has been frequently used also in CMOS circuits to deal with high speed storage devices.

A pulse signal includes a fundamental frequency which is a given repetition frequency of the pulse, and additional higher harmonics superposed on the fundamental mode. Thus, in the design of a bus, it is necessary to take account of waves having frequencies greater than the fundamental mode by one order.

It is also important to know that in actuality a pulse has a finite rise time Tr to rise from the base voltage to the peak voltage, and a finite fall time Tf to fall from the peak voltage to the base voltage. Thus, the pulse has an apparent transition time Tr plus Tf, and hence an apparent frequency ft associated with the apparent transition time. The apparent frequency ft is theoretically given by $$ft = 1/2\pi RC$$

where RC is a time constant of n integration.

The frequency ft is modified by an empirical conversion formula;

$$ft = 0.35/Tr$$

where Tr is given by $$Tr = 2.2RC.$$

Normally, the value of Tr is set to the period for the pulse to achieve 10 to 90% of the peak value. Thus, Tr is multiplied by 0.8 when it is evaluated.

A terminal resistor supposedly has a resistance that matches the characteristic impedance of the bus to minimize the reflection of the waves in the bus. In actuality, however, in addition to the pure resistance, the terminal resistor has a reactance due to a parasitic inductance and a parasitic capacitance that are structurally created in the terminal resistor.

Hence, in order to suppress the reflection of waves by a terminal resistor, it is necessary to take account of the reactance of the terminal resistor itself along with the higher harmonics and the apparent frequency associated with the transition time of the pulse.

FIGS. 1A-3B show simulated circuits of a terminal-resistor under different conditions. The figures also show the results of the simulations.

FIG. 1A illustrates a simulatory terminal resistor having a resistance of 50Ω, coupled with parasitic inductance L1 of 1 nH, and parasitic capacitance C1 of 10 pF. The resistor is connected to the terminal end of a bus T1 having a characteristic impedance Zo=50Ω. The transmission delay time Tpd is 1.5 ns (which amounts to a length of 100 mm on a printed wiring substrate), as shown in FIG. 1A. In the example shown herein, it is assumed that the terminal resistor is an ordinary chip resistor having average characteristics.

In operation, the bus T1 is supplied with a pulse "i" having a base voltage V1=0 Volt, peak voltage V2=3.3 Volts, rise time Tr=5 ns, fall time Tf=5 ns, pulse width Pw=20 ns, and a pulse period Per=50 ns. The repetition frequency f is assumed to be 20 MHz. The apparent frequency ft is determined from the transition time by $$ft = 0.35/(5ns \times 0.8) \approx 100 MHz.$$

The output waveform "ii" is measured at the terminal end of the bus T1, as shown.

FIG. 1B compares the input and output waveforms "i" and "ii", respectively. Although the output waveform "ii" overshoots a little, it has a good waveform. Thus, it is seen that the bus can satisfactorily transmit pulses having an apparent frequency of 100 MHz and repetition frequency f of 20 MHz.

FIG. 2A shows a simulation in which the same bus T1 is terminated with the same terminal resistor as in FIG. 1A. In operation, the bus T1 is supplied with a pulse "i" having a base voltage V1=0 Volt, peak voltage V2=3.3 Volts, rise time Tr=0.5 ns, fall time Tf=0.5 ns, pulse width Pw=2 ns, and pulse period Per=5 ns. The repetition frequency f of the pulse is 200 MHz. The apparent frequency ft is determined from the transition time by $$ft = 0.35/(0.5ns \times 0.8) \approx 1 GHz.$$

The output waveform "ii" is measured at the terminal end of the bus T1.

FIG. 2B compares the input waveform "i" with the resultant output waveform "ii". It is seen in FIG. 2 that the output waveforms "ii" is delayed from the input waveform "i" by the transmission delay time Tpd (1.5 ns) and that the output waveform "ii" is significantly distorted by the resonance of the parasitic inductance L1 and the parasitic capacitance C1 of the terminal resistor. This output waveform "ii" is problematic in that it can greatly influence the threshold level of the pulse signals. In this example, pulses having apparent frequency ft of about 1 GHz cannot be transmitted in good shape under repetition frequency f of 200 MHz.

Referring now to FIG. 3A, the same terminal resistor as in FIGS. 1A and 2A is connected to the starting end of the same bus T1. In operation, the bus is supplied with a pulse "i" having base voltage V1=0 Volt, peak voltage V2=3.3 Volts, rise time Tr=100 ps, fall time Tf=100 ps, pulse width Pw=400 ps, and pulse period Per=1 ns. Its output waveform "ii" is observed at the terminal end of the bus T1. The repetition frequency f of the pulse is 1 GHz. The apparent frequency ft is determined from the transition time as follows;

$$ft=0.35/(100ps \times 0.8) \approx 5 \text{ GHz}.$$

FIG. 3B shows the input and the output waveforms "i" and "ii", respectively. It is seen in the figure that the output waveform "ii" is delayed from the input waveform "i" by the transmission delay time Tpd (1.5 ns) of the bus T1, and is even more distorted by the parasitic inductance L1 and capacitance C1 of the terminal resistor as compared with the waveform of FIG. 2B. Obviously, this waveform "ii" cannot be used as a signal, since the waveform is disastrously distorted, badly affects the threshold level. Thus, under this condition where the repetition frequency f=1 GHz and apparent frequency ft≈5 GHz associated with the transition time, the bus completely fails to transmit the signal.

It is seen from the results of simulations shown in FIGS. 1A-3B, that the distortion of the output waveform "ii" of a pulse increases with the repetition frequency f and the apparent frequency ft associated with the transition time of the pulse. These simulations manifest that the output waveform "ii" is influenced by the parasitic inductance L1 and the parasitic capacitance C1 of the terminal resistor itself, even if the resistance of the terminal resistor is impedance matched with the characteristic impedance of the bus.

A similar simulation can be performed for the bus using a terminal chip resistor which, however, has only one tenth of ordinary parasitic inductance and capacitance (L1=1 nH and C1=10 pF, FIG. 1A).

FIG. 4A illustrates such a simulation circuit, which has now a reduced parasitic inductance L1=100 pH and a reduced parasitic capacitance C1=1 pF. The rest of the parameters of the circuit are the same as the one shown in FIG. 3A.

FIG. 4B compares the input and output waveforms "i" and "ii", respectively, observed in the simulation. It is seen in FIG. 4B that the output waveform "ii" is delayed from the input waveform "i" by the transmission delay time Tpd (1.5 ns) of the bus T1, but has substantially the same waveform as the input waveform with little distortion.

Thus, it can be said that pulses can be successfully transmitted through a bus even when the repetition frequency f is 1 GHz and apparent frequency ft is about 5 GHz, provided that the parasitic inductance L1 and the parasitic capacitance C1 of a chip resistor are sufficiently reduced, for example, to one tenth of their conventional values.

It is noted, however, that the terminal resistor is a chip resistor, which is a discrete part mounted on the wiring substrate to terminate the bus. Consequently, the reactance of the chip resistor, that is, parasitic inductance L1 and parasitic capacitance C1, depends on the length and the width of the chip resistor. A typical chip resistor has already small dimensions on the order of 1.0 mm×0.5 mm. It is therefore very difficult, and seemingly almost impossible, to further reduce the dimensions so that the reactance is reduced by one order as suggested by the simulation shown in FIG. 4A.

If the reactive component of a resistor, that is, L1 and C1, were sufficiently reduced by the size reduction as desired, another technical problem arises from the soldering of the resistor, because soldering induces additional reactance (e.g. 200 pH and 3 pF).

SUMMARY OF THE INVENTION

Therefore, it is an object of the invention to overcome those problems as mentioned above by providing a method of effective bus termination using conventional terminal resistors, thereby permitting successful transmission of high-frequency digital signals under a high repetition frequency on the order of 1 GHz.

It is another object of the invention to provide a terminal resistor capable of effectively suppressing reflective waves in a bus.

It is yet another object of the invention to provide a wiring substrate equipped with terminal resistors for terminating buses formed on the substrate.

It is a further object of the invention to provide a method of manufacturing these terminal resistors and the wiring substrates.

In accordance with one aspect of the invention, there is provided a method of terminating a bus, comprising steps of:

connecting a terminal resistor 2 to one end of a bus 1 formed on an insulative substrate 8a for transmitting a digital signal;

providing in the vicinity of said terminal resistor 2 an insulator having larger dielectric loss angle δ at least in the frequency region of said digital signal than said insulative substrate 8a, wherein said insulator is adapted to absorb high frequency electromagnetic energy in said vicinity.

In accordance with the bus termination method, electrodes are mounted on the terminal end of the bus and the corresponding ground line (or power supply line in some cases) so that the terminal chip resistor is soldered between the electrodes. It is noted that the insulative substrate and/or the insulating material provided in the vicinity of the terminal resistor are/is adapted to have a large dielectric loss angle in the frequency range of the digital signal. (Such insulator hereinafter also referred to dissipative insulator.) The signal passing through the bus past the final receiver branch of the bus is not needed. Therefore, it is necessary to eliminate the signal by transforming it into heat for example. The energy of the signal depends on the characteristic impedance of the bus. In order to completely dissipate the energy, the terminal resistor coupled to the terminal end of the bus is impedance matched with the characteristic impedance of the bus. Because of the parasitic reactance of the resistor, high frequency components of a pulse are reflected. However, all the unnecessary high frequency reflective waves can be advantageously transformed into heat by the dielectric material which is provided in the vicinity of the terminal resistor and having large dielectric loss angle.

The insulator having large dielectric loss angle δ may include a glass material containing a modified ionized additive. In this way, the terminal chip resistor mounted at the terminal end of the transmission line is potted in a thermoplastic or thermosetting organic paste that contains a positive amount of glass powder having a large dielectric loss angle, and then dried or hardened the paste. Because the chip resistor is so covered with the insulator, electromagnetic field generated by the signal and emanating into the insulator is directly affected by the dielectric loss angle and high frequency components of the field are dissipated in the form of heat.

Alternatively, the dissipative insulator for use in the inventive bus termination may be a thermosetting organic material containing a hydroxyl radical. The terminal chip resistor may be covered with the dissipative insulator by potting and heating/drying it in the thermosetting organic material containing a hydroxyl radical. In this example also, high frequency components of the field are dissipated in the form of heat since the chip resistor is covered with the insulator which directly affect the electromagnetic field.

An alternative terminal resistor 2 comprises a glass substrate 21 which contains a modified ionized additive and has large dielectric loss angle δ; a resistive film 22 formed on one surface of the glass substrate; and a pair of electrode 24 formed on the opposite ends of the resistive film 22. Since the glass substrate 21 has larger dielectric loss angle δ than the wiring substrate, energies of the high frequency components of the input digital signals and energies of the high frequency components associated with the apparent transition time are absorbed by the substrate of the terminal resistor. Accordingly, distortions of pulses are suppressed by the terminal resistor connected between the terminal ends of the paired transmission lines on the wiring substrate.

In another aspect of the invention, there is provided a method of manufacturing a terminal resistor, comprising steps of:

preparing a glass substrate 21 which contains a modified ionized additive and exhibits a large dielectric loss angle δ;

forming on one main surface of said substrate a metallic film 22 serving as a resistive film;

forming on said metallic film a metallic electrode layer 23;

forming electrodes 24 which are spaced apart at given intervals, by patterning said metallic electrode layer to form a block consisting of said glass substrate, metallic film, and metallic electrode;

cutting said block in the longitudinal direction along the center lines of said metallic electrodes, and cutting said cut block in the transverse direction at given intervals.

The terminal resistor thus manufactured includes a resistive film formed on a glass substrate containing a modified ionized additive 1 and having large dielectric loss angle δ, and a metallic layer and electrodes formed on the film in turn. Thus, the terminal resistor is structured to absorb high frequency electromagnetic waves.

An inventive wiring substrate comprises:

an insulative substrate 8a;

a multiplicity of paired transmission lines 1 formed on the insulative substrate;

terminal chip resistors 2 connected between the terminal ends of the respective paired transmission lines;

insulators 9 each formed to cover one terminal resistor, said insulator having a larger dielectric loss angle δ than the insulative substrate 8a at least in the frequency range of digital signals to be transmitted.

In this wiring substrate, high frequency components of a digital signal input to the terminal resistor 2 and high frequency components of the apparent transition pulses are absorbed as the power loss by the insulator 9. This can be done by covering each of the terminal resistors 2 and the associated terminal ends of the paired transmission lines on the wiring substrate with the dissipative insulator 9. Thus, the distortions of the waveform of the digital signals can be minimized by the reduction of the components that resonate the parasitic reactance in the terminal resistor.

An alternative wiring substrate of the invention comprises:

an insulative substrate 8a;

a multiplicity of paired transmission lines 1 formed on the insulative substrate;

terminal chip resistors 2 each connected between the terminal ends of the respective paired transmission lines;

insulators 9 formed to cover respective terminal resistors and the terminal ends of the respective paired transmission lines, said insulators having larger dielectric loss angle δ than the insulative substrate 8a at least in the frequency range of the digital signals transmitted by the transmission lines. In this arrangement, not only the terminal resistors 2 at the respective terminal ends of the paired transmission lines 1 formed on the wiring substrate but also the terminal sections of the paired transmission lines 1 are covered with the dissipative insulators 9. Accordingly, the high frequency components of a digital signal are absorbed by the insulator 9 before they enter a terminal resistor, thereby further reducing the distortions of the waveform of the pulse.

The dissipative insulator 9 used in the inventive wiring substrate can be a composite material made of a mixture of glass powder containing at least a modified ionized additive and an organic resin.

The dissipative insulator 9 can be a thermosetting organic material containing a hydroxyl radical.

The dissipative insulator 9 can be a mixture of glass powder containing a modified ionized additive and a thermosetting organic material containing a hydroxyl radical.

The dissipative insulator 9 covering the terminal resistor 2 or covering the terminal resistor 2 and the terminal ends of an associated paired transmission lines 1, can be either a composite material of glass powder containing a modified ionized additive and an organic resin, a thermosetting organic material containing a hydroxyl radical, or a mixture thereof. Accordingly, the insulator 9 absorbs the energy of high frequency components of a digital signal and of an apparent transition pulses.

The terminal resistor for use in the inventive wiring substrate comprises:

a glass substrate containing a modified ionized additive and having a dielectric loss angle δ which is greater than that of wiring substrate;

a resistive film formed on one surface of the glass substrate; and a pair of electrodes formed on the opposite ends of the resistive film.

It is noted that in this inventive wiring substrate the terminal resistor 2 and the associated terminal ends of the paired transmission lines 1 are covered with the dissipative insulator 9, and that the terminal resistor itself has a dissipative glass substrate. Accordingly, the energy of high frequency components of a digital signal and of apparent transitional pulse may be effectively absorbed.

In a further aspect of the invention, there is provided a method of manufacturing a wiring substrate, comprising steps of:

preparing an insulative substrate 8a having thereon paired transmission lines;

mounting and connecting terminal chip resistors 2 with the terminal ends of the respective paired transmission lines;

preparing a sticky organic potting resin solution having larger dielectric loss angle δ than the insulative substrate at least in the frequency range of digital signals to be transmitted by the transmission lines;

dropping said sticky organic potting resin solution 9 on and around each terminal resistor 2 for potting, or on and around each terminal resistor and the terminal sections of the associated paired transmission lines 1 for potting; and hardening the organic potting resin.

In this method, potting the solution of organic potting resin 9 having a large dielectric loss angle δ may only be required on the terminal resistor 2 connected to the associated terminal ends of paired transmission lines. Hence, a dissipative wiring substrate capable of absorbing high frequency electromagnetic energy can be manufactured in a simple way.

The potting resin may be either a mixture of glass powder containing a modified ionized additive and an organic resin, or a mixture of glass powder containing a modified ionized additive and an thermosetting organic material containing a hydroxyl radical.

The inventive wiring substrate may comprise:

an insulative substrate including predetermined dissipative regions having a larger dielectric loss angle at least in the frequency region of pulse signals than the rest regions of said insulative substrate;

paired transmission lines having terminal ends positioned in the respective predetermined regions of said insulative substrate;

terminal chip resistors each connected between the terminal ends of the respective paired transmission lines.

In the wiring substrate, the at least predetermined region thereof has a larger dielectric loss angle in the frequency region of digital signals transmitted on the paired transmission lines than the rest of the substrate, so that the high frequency components of a signal input to the terminal resistor and of the accompanying apparent transition pulse are absorbed or dissipated by that region of the substrate. Thus, the distortions of the waveform of a pulse signal transmitted on the paired transmission lines are minimized without deteriorating the pulse transmission on the transmission lines, owing to the energy dissipation of the high frequency components which would otherwise interfere with the parasitic reactance of the terminal resistor.

The wiring substrate has a feature that each of the predetermined regions extends to the terminal sections of the respective paired transmission lines. In this wiring substrate, since the each of the energy dissipative regions of the insulative substrate having a large dielectric loss angle extends over the terminal sections of paired transmission lines, the dissipative region well absorb high frequency components of a digital pulse signal and of the associated apparent transition pulse prior to entering the terminal resistor, thereby reducing the distortion of the waveform of the pulse.

The dissipative regions of said insulative substrate of the wiring substrate may be formed of a mixture of glass powder containing a modified ionized additive and an organic resin. Alternatively, the dissipative regions are formed of a thermosetting organic material containing a hydroxyl radical. Alternatively, the dissipative regions are formed of a mixture of glass powder containing at least a modified ionized additive and a thermosetting organic material containing a hydroxyl radical.

Alternatively, the dissipative regions may be formed of a mixture of glass powder containing at least a modified ionized additive and an organic resin, a thermosetting organic material containing a hydroxyl radical, or a mixture of these materials. This wiring substrate thus absorbs energy of the high frequency components of a digital pulse signal and of the associated apparent transition pulse.

The terminal resistor for use in the inventive wiring substrate comprises:

a glass substrate containing a modified ionized additive and having a dielectric loss angle δ which is greater than that of the wiring substrate;

a resistive film formed on one main surface of the glass substrate; and a pair of electrodes formed on the opposite ends of the resistive film.

In this wiring substrate, since the predetermined dissipative region of the insulative substrate has a greater dielectric loss angle in the frequency region of the digital pulse signal than the rest regions of the transmission lines, high frequency components of a digital signal and the apparent transition wave associated with it can be effectively absorbed by the energy dissipative region.

In a still further aspect of the invention, there is provided a method of manufacturing a wiring substrate, comprising steps of:

preparing a pre-hardened thermosetting insulative substrate 8a;

forming holes 8b having a predetermined size, at predetermined positions of the insulative substrate;

forming a pre-hardened thermosetting insulative slab member 7 which has a greater dielectric loss angle δ at least in the frequency region of the digital signal to be transmitted than the dielectric loss angle of the insulative substrate;

dicing the insulative slab member into individual embedding members 7a having predetermined dimensions to fit in the respective holes of the insulative substrate;

embedding and heating said embedding members in the respective holes to form a mixed insulation type substrate which has predetermined regions of a larger dielectric loss angle at least in the frequency region of digital signals transmitted than the rest of said substrate;

forming paired transmission lines having terminal sections located in the respective predetermined regions of said mixed insulation type substrate; and placing and connecting terminal chip resistors between the terminal ends of the respective paired transmission lines.

This manufacturing method permits provision of: holes 8b having a predetermined size formed at predetermined positions of the pre-hardened insulative substrate 8a; a pre-hardened thermosetting insulative slab 7 having a larger dielectric loss angle, which slab is then cut into embedding members dimensioned to be embedded in the hole 8b. The embedding members are embedded in the respective holes 8b in the insulative substrate, and then heated to form a mixed insulation type substrate. Thus, the substrate has predetermined regions having a larger dielectric loss angle, at least in the frequency region of a transmitted digital pulse signal, than the rest regions of the substrate. In a subsequent step of its manufacture, the paired transmission lines are placed on the substrate such that their terminal sections lie in the respective energy dissipative regions. This provides a mixed insulation type wiring substrate which has energy dissipative regions where a terminal resistor is placed.

The pre-hardened thermosetting insulation slab member 7 may be either a mixture of glass powder containing a modified ionized additive and an organic resin; or a mixture of glass powder containing a modified ionized additive and an organic thermosetting material containing a hydroxyl radical.

The holes 8b formed for the respective multiple pairs (e.g. 64 pairs) of transmission lines may be integrated to a common hole for the multiple paired transmission lines. In this instance, the embedding members may be also integrated to a single embedding member, which can be easily embedded in the common hole, thereby simplifying the manufacturing process.

The integrated hole 8b may have a size which corresponds to the respective terminal ends and terminal sections of the respective paired transmission lines.

In this case, manufacture of the wiring substrate is further simplified since the multiplicity (e.g. 64) of paired transmission lines are associated with a single embedding substrate fitted in a common hole for paired transmission lines. In addition, since the terminal sections of the paired transmission lines are simultaneously embedded with the embedding member, the high frequency components of the pulse signals are well absorbed before entering the terminal resistors, thereby further reducing the distortions of the signals.

In a further aspect of the invention, there is provided a method of terminating a bus, comprising steps of:

connecting a terminal resistor to the terminal end of a bus provided on an insulative substrate for transmitting a digital signal; and providing in the vicinity of said terminal resistor an insulator mixed with a magnetic material such that said insulator absorbs high frequency components of electromagnetic waves in said vicinity.

A wiring substrate of the invention comprises:

an insulative substrate;

a multiplicity of paired transmission lines formed on the insulative substrate;

terminal chip resistors each connected between the terminal ends of the respective paired transmission lines; and insulators formed to cover the respective terminal resistors and the terminal sections of said paired transmission lines connected with said terminal resistors, said insulators being made of a mixture of a magnetic material and an organic resin.

In a further aspect of the invention, there is provided a method of manufacturing a wiring substrate, comprising steps of:

preparing an insulative substrate having thereon paired transmission lines;

mounting and connecting terminal chip resistors between the terminal ends of the respective paired transmission lines;

preparing a sticky organic potting resin solution mixed with a magnetic material;

dropping the sticky organic potting resin solution onto the terminal resistors and the vicinities thereof for potting, or onto the terminal resistors, the vicinities thereof, and terminal sections of the associated paired transmission lines for potting; and hardening the organic potting resin.

A further wiring substrate of the invention comprises:

an insulative substrate having insulative members which are formed in predetermined regions thereof and made of a mixture of a magnetic material and an organic resin;

paired transmission lines having terminal ends positioned in said predetermined sections of said insulative substrate; and terminal chip resistors each connected between the terminal ends of the respective paired transmission lines.

The method of manufacturing a wiring substrate in accordance with another aspect of the invention comprises steps of:

preparing a pre-hardened thermosetting insulative substrate;

making holes at predetermined locations of said insulative substrate, said holes having a predetermined size;

forming a pre-hardened thermosetting insulative slab member made of a mixture of a magnetic material and an organic resin;

dicing said insulative slab member into individual embedding members dimensioned to fit in the respective holes of said insulative substrate;

embedding and heating said embedding members in the respective holes to form mixed insulation type substrate which has predetermined regions of a large magnetic loss angle;

forming paired transmission lines such that the terminal ends of the respective paired transmission lines are located in the respective predetermined regions;

placing and connecting terminal chip resistors between the terminal ends of the respective paired transmission lines.

Thus, in accordance with the invention, a magnetic material having a large magnetic loss angle can be used as an insulator in place of glass powder to dissipate undesirable high frequency reflective waves.

BRIEF DESCRIPTION OF THE DRAWINGS

FIG. 8 shows a frequency spectrum of pulse in terms of crest value of pulse.

FIGS. 12A-12B show a fourth embodiment of the invention, illustrating another wiring substrate and a process of its manufacture.

DETAILED DESCRIPTION OF THE PREFERRED EMBODIMENT

Figure 1A:
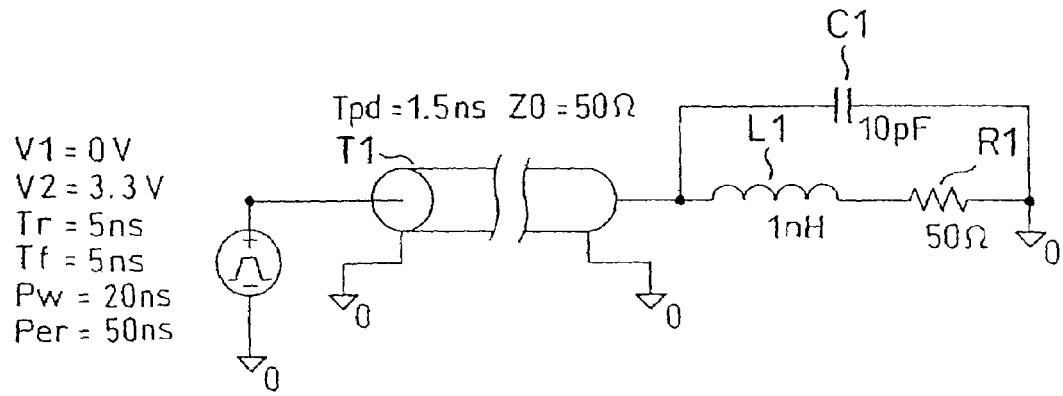
FIGS. 1A-1B show a simulation using a first terminal resistor, along with the result of the simulation.
Figure 1B:
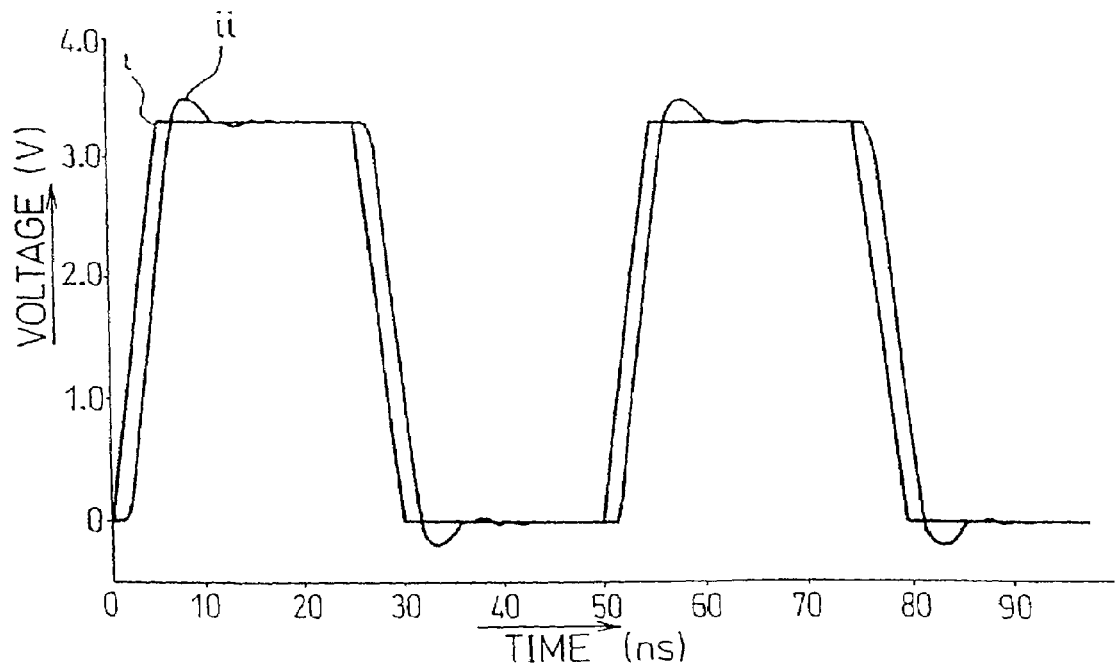
Figure 2A:
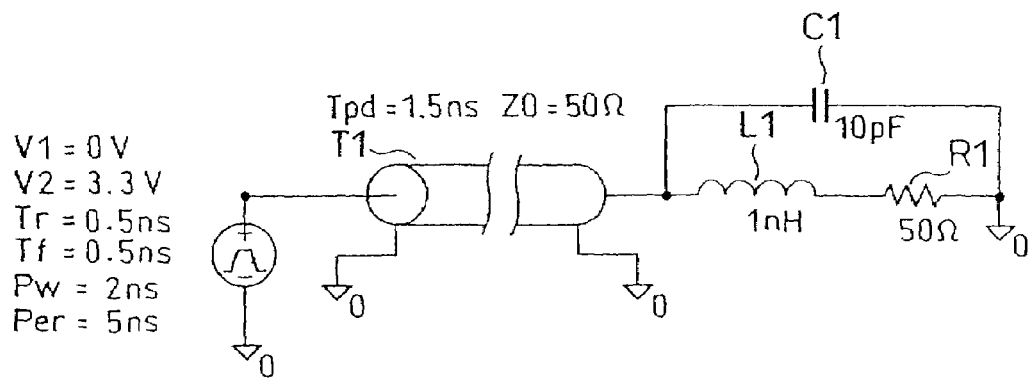
FIGS. 2A-2B show a simulation using a second terminal resistor, along with the result of the simulation.
Figure 2B:
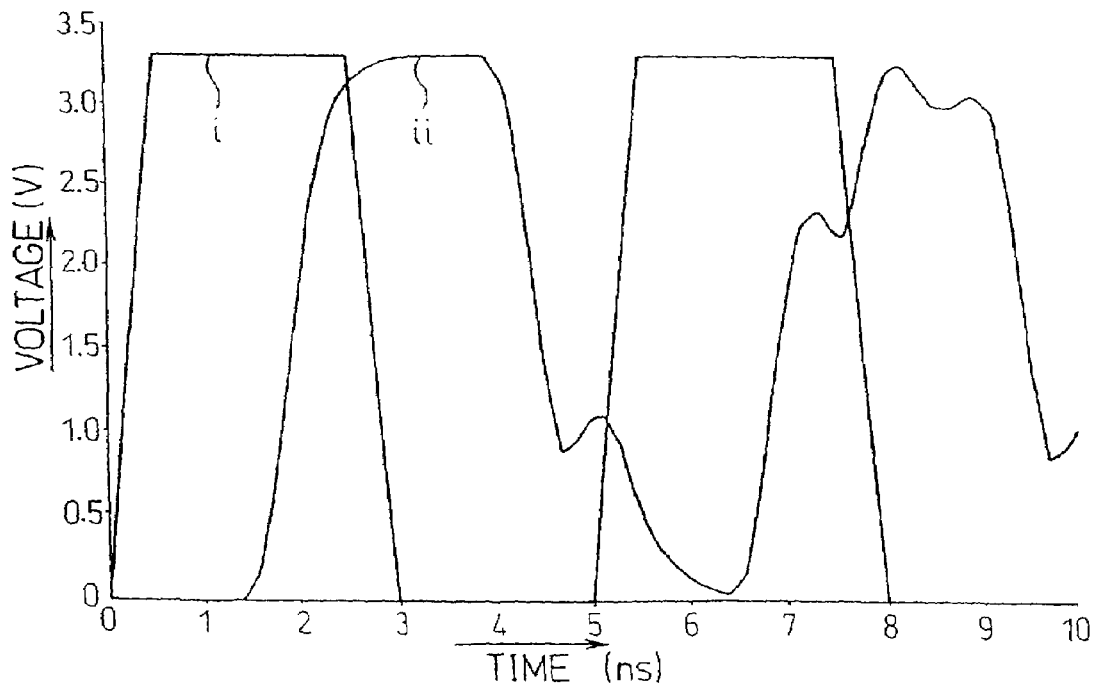
Figure 3A:
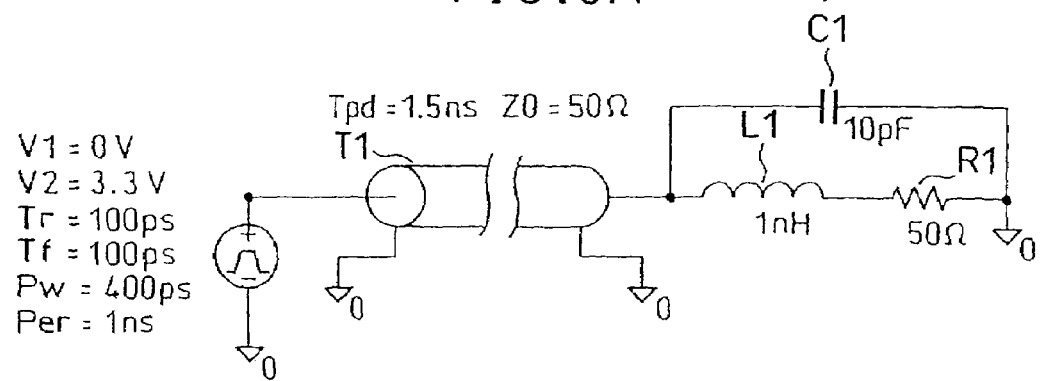
FIGS. 3A-3B show a simulation utilizing a third terminal resistor, along with the result of the simulation.
Figure 3B:
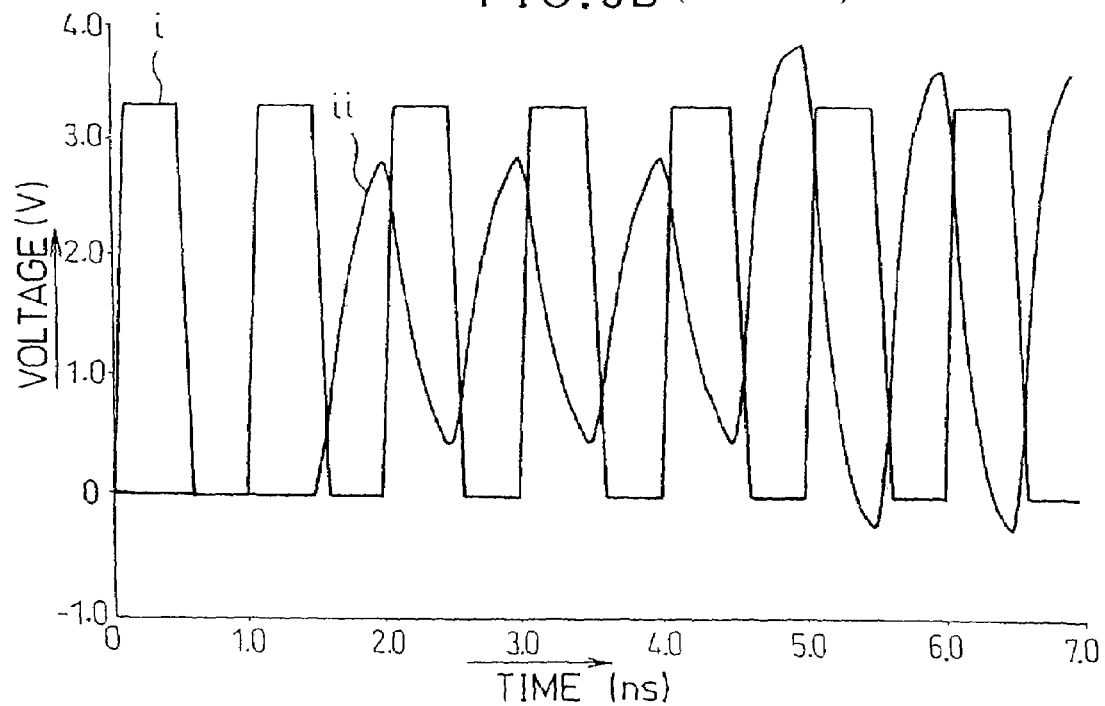
Figure 4A:
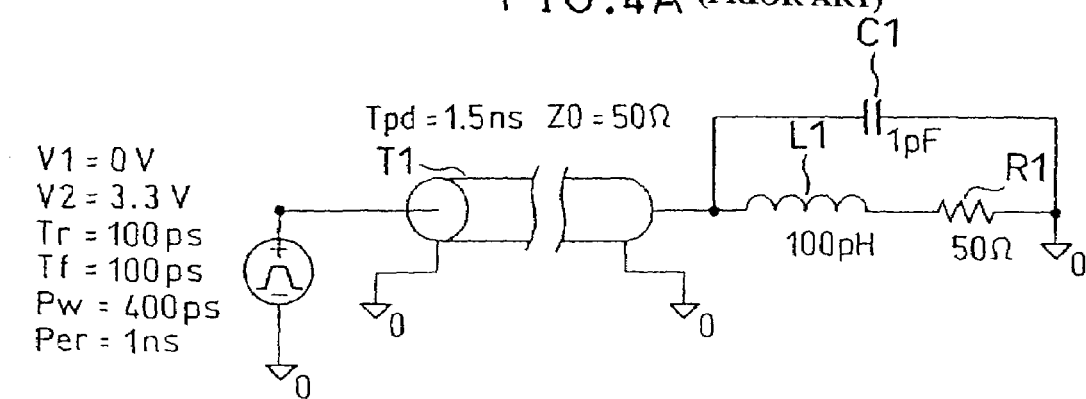
FIGS. 4A-4B show a simulation using a fourth terminal resistor, along with the result of the simulation.
Figure 4B:
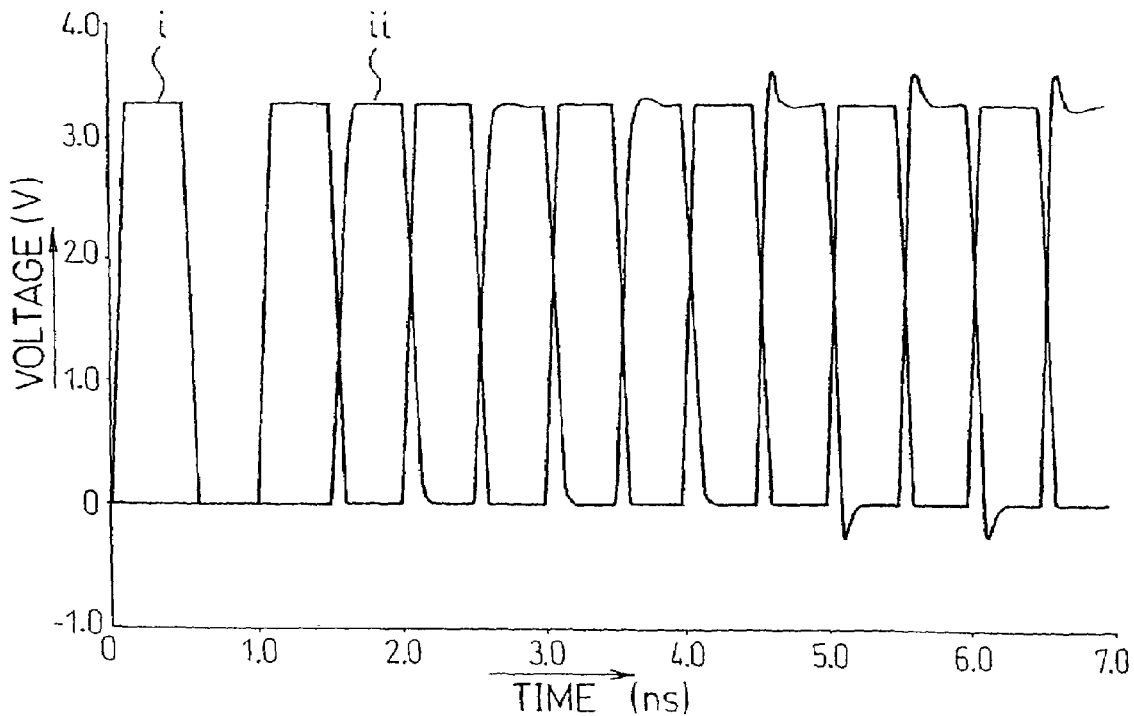

In the transmission of a high frequency digital signal on a bus formed on a wiring substrate, a non-dissipative material is used as the substrate material in order to circumvent the deterioration of the waveform of the signal caused by the dissipation of energy. Such non-dissipative material has a small dielectric loss angle δ (and hence having a small dielectric tangent δ). In addition, in order to eliminate the reflections of the signals at the terminal end of the bus, a terminal resistor is connected to the terminal end of the bus. The terminal resistor has an impedance matched with that of the bus. However, any terminal resistor has a frequency dependent parasitic reactance (parasitic inductance L1 and parasitic capacitance C1), which can affect the high frequency components of a digital pulse signal and of the apparent frequencies associated with the actual transition time of the pulse, thereby resulting in distortions in the waveform of the pulse signal.

The invention is directed to solve this problem, based on a fundamental principle that given a terminal resistor connected to a terminal end of a bus formed on a wiring substrate, an insulator having a large dielectric loss angle δ can be provided in the vicinity of the terminal resistor to absorb the high frequency components of a pulse, thereby permitting successful transmission of the signal in the GHz region. The terminal resistor need not be special and can be convention one.

A preliminary account of dielectric loss angle will be given before describing the invention in detail. An insulator normally exhibits polarization under a given electric field. Such polarization includes space-charge polarization, dipole polarization, ionic polarization, and electronic polarization.

Spatial charge polarization results from an uneven deviations of ions and charges, concentrating in a region where dielectric constant and/or conductivity changes abruptly, resulting in an apparent polarization of the space charge.

Dipole polarization results from the interaction of the dipole moments of molecules and an externally applied electric field. These polar molecules tend to re-orient in their favored direction parallel to the electric field.

Ionic polarization results from the displacements of ions in an ionic crystal under an electric field, which changes the relative positions of positive and negative ions to create apparent dipoles.

Electron polarization results from the relative displacements of electrons about the positive nucleus of each atom under an applied electric field, creating atomic polarization.

Polarization must follow the change in the applied electric field. Otherwise, polarization lags behind the electric field. Hence, polarization of space-charge and of heavy-molecules are slow. Slow polarization disturbs oscillatory modes that exist in a physical system, and dissipates energy in the form of heat. The delay in phase of the polarization with respect to the applied field is called dielectric loss angle and is given by the following formula;

$$\kappa_s \theta^{-j\delta} = \kappa^* = \kappa' - j\kappa'' = \in^*/\in 0 = (1/\in 0)(\in' - j\in'')$$

$$\kappa' = \kappa_s \cos \delta$$

$$\kappa'' = \kappa_s \sin \delta$$

$$\tan \delta = \kappa''/\kappa' = \in''/\in' \quad (1)$$

where δ is the dielectric loss angle, $\kappa_s \theta^{-j\delta}$ is a complex or vectrial dielectric constant, $\in^*$ is a complex relative dielectric constant, $\in 0$ is the permittivity of vacuum, $\in'$ and $\in''$ are the real and the imaginary parts of the complex dielectric constant, respectively, tan δ is called dielectric loss tangent.

The voltage Vo applied to a terminal resistor is influenced by the dielectric loss, the amount of which is given by $$\omega \in '' Vo/\in 0 (=\omega(\in'/\in 0)Vo \tan \delta = \omega \in rVo \tan \delta)$$

where ω is the angular frequency, and $\in$ r is the relative dielectric constant. The power loss P is a product of voltage loss Vloss and current I, so that the current I is given in terms of the voltage Vo and the resultant impedance Z, as follows.

$$I = \omega \in r(Vo)^2 \tan \delta/Z$$

The resultant impedance Z is a frequency dependent quantity.

Thus, the power loss P increases with the dielectric loss angle δ, dielectric constant $\in$, and the angular frequency ω. Consequently, most of the energy of high frequency components of a pulse and of the apparent transition pulse is absorbed by the insulator as the power loss P.

As discussed previously, the response of polarization to the electric field becomes slow if the polarization involves space-charges or massive molecules. That is, polarization of a material has a frequency characteristic which depends on the structure of the material. In other words, dielectric loss angle δ has an ω dependence, which is, however, not fully known yet.

As we saw, there are four different types, of polarization (space-charge, dipole, ionic, and electron polarization). It is known that the four types of polarization have respective characteristic frequencies fo. If the frequency f of the electric field applied to a dielectric is sufficiently lower than the characteristic frequency fo of the dielectric (f<fo), then the relative dielectric constant will be substantially constant, and so is the power loss. Conversely, if the frequency f of the electric field is exceedingly larger than the characteristic frequency fo (f>fo), then the relative dielectric constant is about 1, so that the dielectric loss angle δ is about 0.

Figure 5:
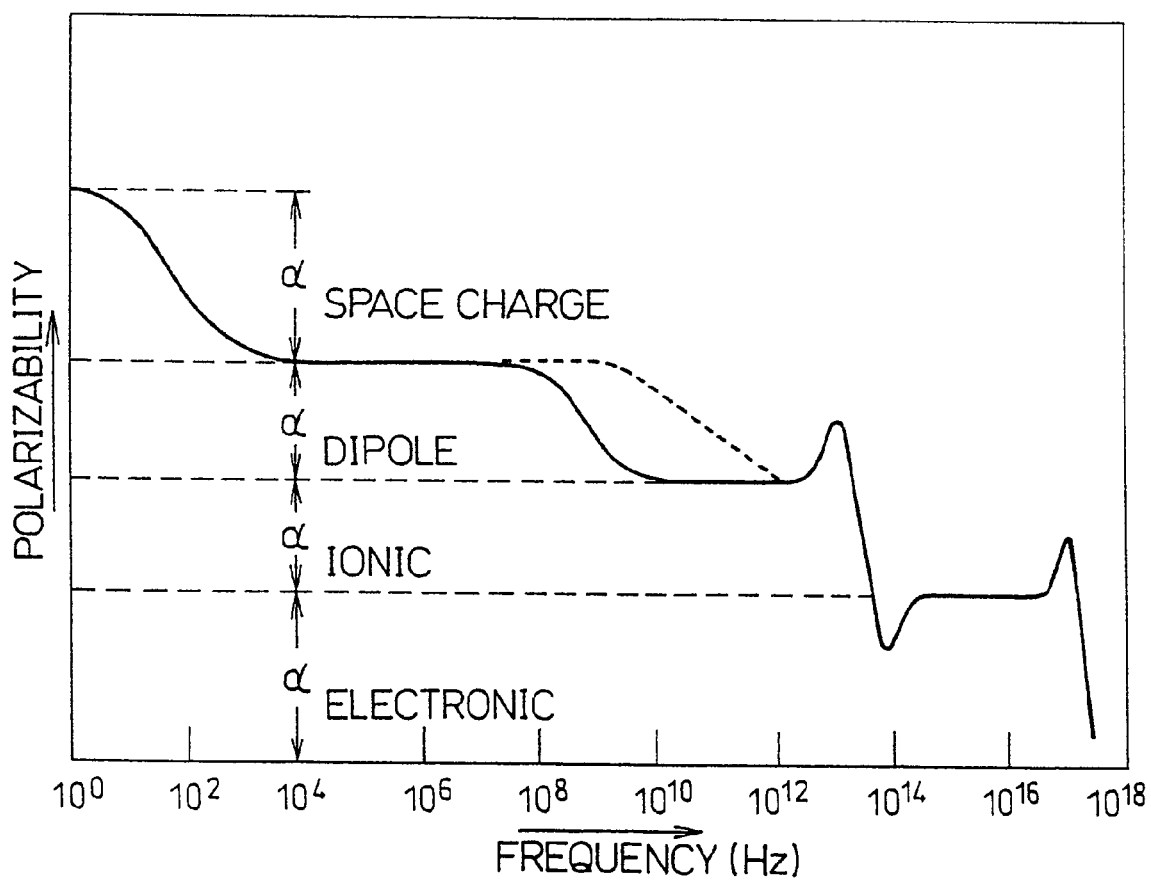
FIG. 5 shows frequency characteristics of different types of polarization.

FIG. 5 shows frequency characteristics of polarizability α (i.e. relative dielectric constant) for four different types of polarization. It is seen in FIG. 5 that the polarizability of dipole polarization becomes about 1, indicating that dipole polarization is above its characteristic. In this frequency region, the dielectric loss angle δ is about 0. Because the present invention is concerned mainly with the range above 1 GHz, those dielectrics such as titanium barium are of no use, since they exhibit dipole type polarization due to atomic transition and their dielectric loss angles are substantially zero above 1 GHz.

On the other hand, ionic polarization takes place in the infrared region and exhibits delayed polarization in the GHz region, as shown in FIG. 5. Hence, it can be used as the dissipative dielectric material of the invention.

It should be born in mind that ionic crystals, sodium chloride in particular, are water soluble, that water solutions are conductive by ionic conduction, and that they are erosive. Therefore, ionic crystals cannot be used as structural materials of electronic devices.

However, in glasses ionized cation additives are modified as they are ionized, they can be used as preferable ion containing insulators in the invention. For example, soda glass (ordinary glass) has a relative dielectric constant between 3 and 4, dielectric loss tangent δ of about 0.02 in the frequency range at least up to 10 GHz. Considering the nature of the polarization, it is anticipated that they will maintain these characteristics probably up to the infrared region.

Given a class as a dissipative dielectric material, it cannot be applied to the regions adjacent terminal resistors by softening or melting the glass if the terminal resistors are soldered to a substrate, since the softening point of glass is about 800° C. In such cases, glass may be used in the form of powder. To do this glass powder is first enriched with a modified ionized additive, mixed with an organic paste or B state material (pre-hardened thermosetting resin) to an extent of 60-80% by weight, and is applied to the regions of the terminal resistors using any known coating technique.

A broken curve shown in FIG. 5 represents a characteristic polarizability-frequency curve of an epoxy resin, which is a typical example of such thermosetting organic material. Thermosetting polymers such as epoxy resin harden after it is applied to an object thorough chemical reactions, developing a 3-dimensional mesh structure. Of the thermosetting polymers, those which contain hydroxyl (OH) radicals have sufficiently high polarizability (and hence large dielectric constant) and large dielectric loss tangent δ above 1 GHz ($10^9$ Hz), as shown in FIG. 5.

Thus, thermosetting polymers such as epoxy resins containing much hydroxyl radicals are suitable as a insulator of the present invention. Another desirable candidate for the insulator is a glass material having a large ionic polarizability mixed with such an epoxy resin as mentioned above. Glass containing an oxide of a rare-earth element is also suited for the invention.

The invention will now be described in detail with reference to accompanying drawings.

Figure 6:
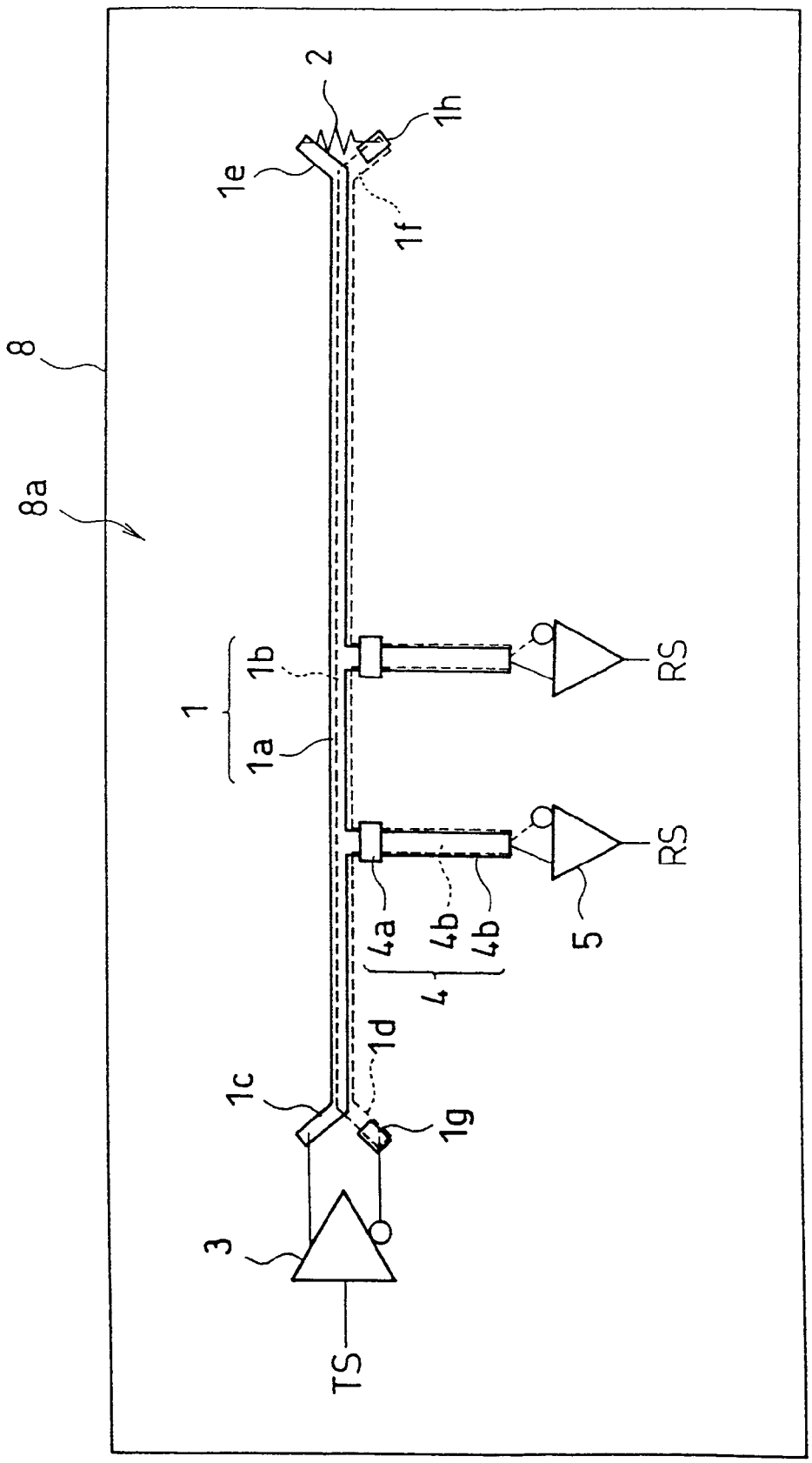
FIG. 6 shows a first method of terminating a bus system according to the invention.

Referring to FIG. 6, there is shown a typical signal transmission bus system, to which a first method of terminating a bus is applied in accordance with the invention. A set of paired transmission lines 1 (called stacked pairs of transmission lines) includes a first signal transmission line 1a placed on an insulative layer 8a of a wiring substrate 8, and a second signal transmission line 1b underlying the insulative layer 8a and running in parallel with the signal transmission line 1a, as shown in FIG. 6.

The insulative layer 8a is preferably a layer of insulator having a small dielectric loss angle in order to suppress both the distortions in waveforms of the digital signal transmitted on the line and the heat generation by dielectric loss. This is the case not only in this embodiment but also in any other embodiments of the invention.

Provided at the ends of the signal transmission lines 1a and 1b closer to the driver circuit 3 are a pad electrode 1c and a contact electrode 1d in such a way that they do not face each other. Similarly, a pad electrode 1e and a contact electrode 1f are provided at the terminal ends of the first and the second signal transmission lines 1a and 1b, respectively, such that they do not face each other. On top of the insulative layer 8a is a pad electrode 1g in contact with the contact electrode 1d of the second signal transmission line 1b through a via hole formed in the insulative layer 8a, and a pad electrode 1h in contact with the contact electrode 1f of the second signal transmission line 1b through a via hole.

A driver chip (not shown) having the driver circuit 3 is flip bonded or wire bonded so that the driver circuit 3 is connected to the pad electrode 1c and pad electrode 1g of the paired transmission lines 1. Provided at a middle of the paired transmission lines 1 are branch lines 4 which include paired branch resistor chips 4a and paired branch lines 4b extending from the paired branch resistor chips 4a. At the end of the paired branch lines 4b are receiver circuits 5. It is noted that in order to minimize reflection of a signal by the branches 4, the distance between the paired transmission lines 1 and the paired branch resistors 4a is preferably as short as possible, and the resistances of the paired branch resistors 4a are as large as possible.

Provided at the terminal end of the paired transmission lines 1 are impedance matched terminal resistors 2. The terminal resistors 2 are chip resistors coupled to the pad electrode 1e and pad electrode 1h of the paired transmission line 1 by, for example, a flip bonding technique.

In accordance with the invention, an insulator having large dielectric loss angle δ is placed around or near the terminal resistors 2 connected to the terminal ends of the paired transmission lines 1. The insulator preferably has a dielectric loss angle larger than that of insulative layer 8a at least in the frequency region of the digital signal transmitted through the paired transmission lines 1.

Satisfactory insulation by the insulator can be implemented in three ways: (1) the substrate of the chip resistor itself be made of an insulative material having a large dielectric loss tangent δ; (2) chip resistor be coated with an insulative material having a large dielectric loss tangent δ; and (3) the insulative layer 8a underlying the chip resistor be made of an insulator having a large dielectric loss tangent δ.

In this way, the energy of the high frequency components of the digital pulse signals and of the apparent transition pulses entering the terminal resistors 2 can be absorbed as the power loss P by the dissipative insulator. The absorbed energy is dissipated in the form of heat, so that, unlike the energy absorbed by the reactance, it never comes back to the terminal resistor. There will be no other relevant radiation affecting the paired transmission lines. Thus, through the reduction of the resonating energy of the parasitic inductance L1 and the parasitic capacitance C1 of the chip resistor 2, distortions of the pulse signals on the paired transmission lines 1 are minimized.

High frequency components of the digital signal and the apparent transition pulses are important elements of the pulse signals, and must remain on the paired transmission lines 1. Therefore, it is necessary to limit the dissipative insulator only in the vicinity of the terminal resistors 2. The insulator should not extend along the paired transmission lines 1.

Although the wiring substrate 8 can be of single layer, multi-layer structures formed by stacking one substrate upon another are preferred. In the case of a multi-layer substrate, the uppermost layer is used as the substrate 8 shown in FIG. 6. Although FIG. 6 illustrates only one set of paired transmission lines 1, there are in actuality a multiplicity (e.g. 64) of such paired lines running in parallel in accordance with the bits of the digital system.

The invention may be applied to other types of bus lines than the one shown in FIG. 6, including for example microstrip lines, coplanar lines, and strip lines.

Figure 7A:
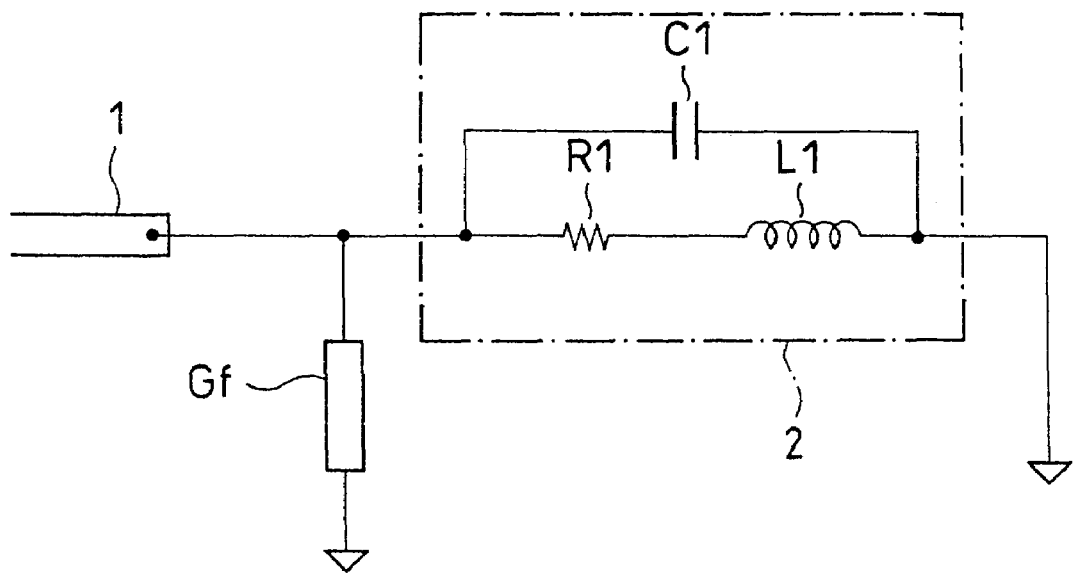
FIGS. 7A-7B show an equivalent circuit for an inventive terminal resistor and an insulator provided at the terminal ends of a bus, along with the observed high frequency characteristic of a loss conductance Gf of the circuit.
Figure 7B:
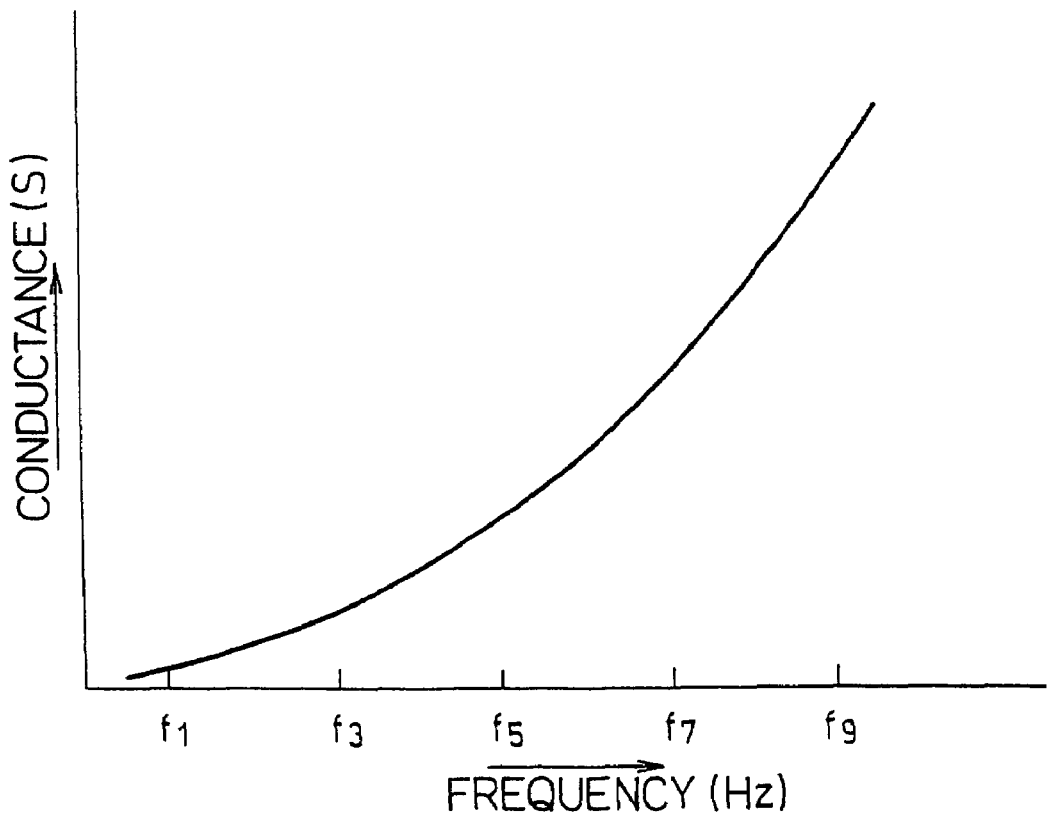

FIG. 7A shows an equivalent circuit of a terminal section of a bus system, which includes a terminal resistor 2 and a dissipative insulator having a large dielectric loss angle δ placed in the vicinity of the terminal resistor. FIG. 7B shows a frequency characteristic of the conductance (G=I/V) of the dissipative insulator.

The terminal resistor 2 shown in FIG. 7A has a resistance R1 which is matched to the characteristic impedance Zo of the bus 1. The impedance Zo consists of parasitic inductance L1 and parasitic capacitance C1. Conductance Gf is connected to the node of the bus 1 and the terminal resistor 2.

The conductance Gf represents the absorptive nature of the dissipative insulator having a large dielectric loss tangent δ placed in the vicinity of the terminal resistor. The conductance Gf increases with frequency, as shown in FIG. 7B. Further, f1 through f9 shown in the abscissa represent the odd harmonics of a pulse up to the ninth.

FIG. 8 shows a typical frequency spectrum of a pulse in terms of relative crest value with reference to the fundamental mode f1 (=1 GHz). In the example shown in FIG. 8, the pulse includes, in addition to the fundamental mode, third higher harmonic (30% at frequency f3), fifth higher harmonic (13% at f5), seventh higher harmonic (5% at f7), and ninth higher harmonic (3.0% at f9). Although not shown in FIG. 8, the pulse further includes a 3.5 GHz component of the apparent frequency associated with the apparent pulse transitions, which amounts to 80% of the fundamental mode.

From the equivalent circuit of FIGS. 7A, 7B and the characteristic frequency curve shown in FIG. 8, it is seen that much of the energy of a digital signal transmitted from the paired transmission lines 1 into the terminal resistor 2 is absorbed by the impedance matched resistor R1, thereby suppressing the reflection of the pulse. However, high frequency components of the pulse and the apparent transitions can still exhibit strong resonance with the reactance ($\omega L1$ and $1/\omega C1$) due to the parasitic inductance L1 and the parasitic capacitance C1 of the terminal resistor 2, since they are frequency dependent. It should be noted that in accordance with the invention these high frequency components will be eliminated as the power loss P by the dissipative insulator provided in the vicinity of the terminal resistor 2. This absorption of the energy, represented by conductance Gf in FIG. 7A, significantly increases with frequency f.

Thus, the frequency dependent dissipative insulator eliminates the higher frequency modes as the power loss P that would otherwise resonate with the parasitic inductance L1 and parasitic capacitance C1. In this way, the bus transmitting a GHz digital signal can be adequately terminated using a conventional terminal resistor in accordance with the invention.

It is true that additional parasitic inductance and capacitance may arise by soldering the chip resistor to the substrate, which can, however, be safely eliminated by the same dissipative insulator. Accordingly, conventional mounting techniques can be used in the invention for a digital system operating in a GHz region. This is the case in any other embodiments of the invention.

In accordance with the second embodiment of the invention, a terminal resistor and a method of its manufacture will now be described.

Figure 9A:
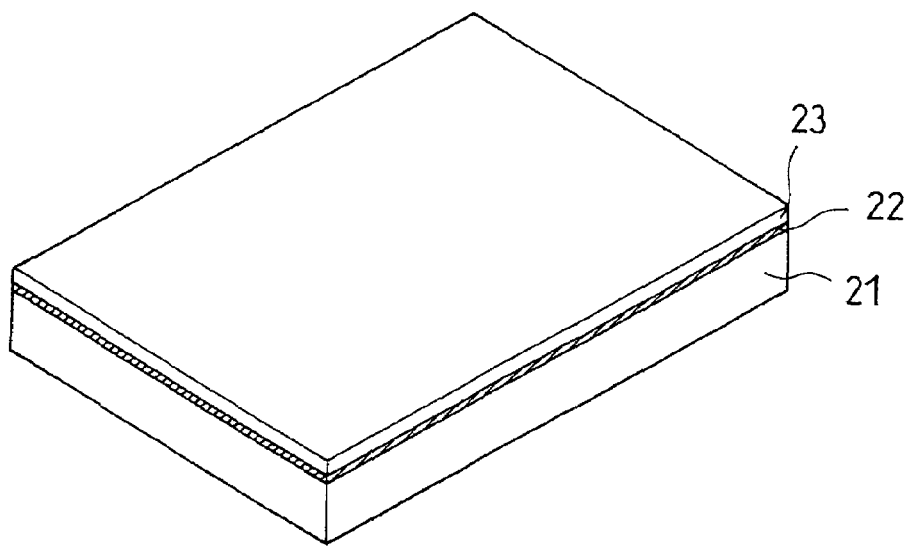
FIGS. 9A-9C show a second embodiment of the invention, illustrating a terminal resistor and a process of manufacturing the terminal resistor.

First, a substrate 21 is prepared, as shown in FIG. 9A. The substrate may be a glass plate in which a modified cation additive is added. Such glass substrate 21 has large dielectric loss angle $\delta$. The dissipative insulator must have a dielectric loss angle $\delta$ which is larger than that of the wiring substrate supporting thereon a terminal resistor in accordance with the invention. The glass plate preferably contains as much oxides of ionic elements such as sodium (Na), potassium (K), strontium (St), calcium (Ca), magnesium (Mg), barium (Ba), as possible. The more oxides it contains, the more ionic influence it has on the dielectric loss tangent $\delta$ of the glass plate. Ordinary glasses including plate glass, bottle glass, and press-glass are all satisfactory for the purpose of the invention.

Next, the substrate 21 is provided on one main surface thereof with a thin metallic resistive film 22 of tantalum (Ta) and/or chromium (Cr) for example by means of sputtering for example. The substrate is provided with a further metallic electrode layer 23 of copper (Cu) or nickel (Ni) for example.

Figure 9B:
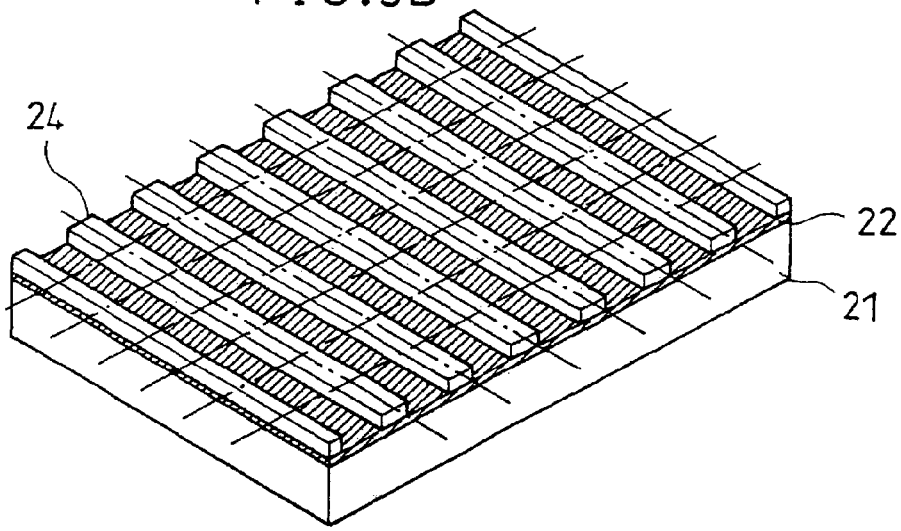

The electrode layer 23 is then subjected to photolithography for patterning to form elongate electrodes 24, as shown in FIG. 9B. The substrate is then diced into individual terminal chip resistors 2 having predetermined dimensions by first cutting the substrate along the longitudinal center lines of the elongate electrode by means of a dicing machine, and then cut in the transverse direction (i.e. in the direction perpendicular to the elongate electrodes 24) at predetermined regular intervals.

Figure 9C:
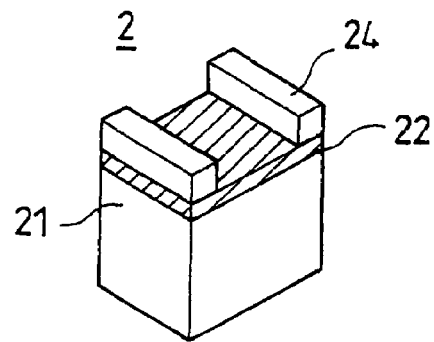

In the example shown herein each of the terminal chip resistors 2 has a glass substrate 21 as shown in FIG. 9C which contains a modified cation additive. The dielectric loss tangent $\delta$ of the glass is larger than that of the wiring substrate. The terminal chip resistor has a pair of metallic electrodes 24 formed on the resistive film 22 overlying the glass substrate 21. The terminal resistor 2 is bonded to the pad electrodes 1e and 1h provided at the terminal ends of paired signal lines 1 as shown in FIG. 6, by a flip chip bonding process, with one main surface of the terminal resistor facing downward i.e. facing the substrate.

Thus, part of the energy of the high frequency components of the digital signal input to the paired transmission lines 1 and of the apparent transition pulses is absorbed by the dielectric substrate 21 of the terminal resistor 2 itself. Thus, the absorption reduces the energy that would otherwise resonate the parasitic inductance and the capacitance in the terminal resistor 2, thereby reducing the distortions of the signal on the paired transmission lines 1.

It should be appreciated that the terminal resistor can be used also as a damping resistor to prevent problematic high frequency electromagnetic interference (EMI), particularly the resonance between the reactance of the terminal resistor and any other high frequency components if any.

Referring to FIGS. 10A-10C, 11A and 11B, a third embodiment of the invention will now be described. This embodiment is concerned with a wiring substrate and a method of its manufacture.

Figure 10A:
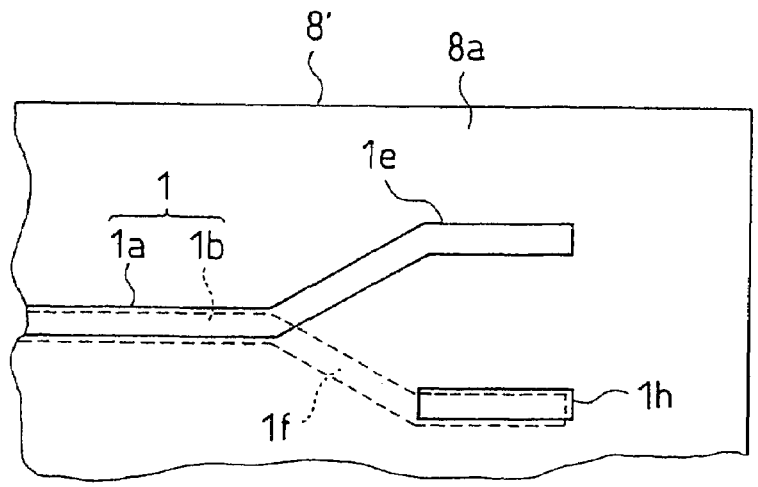
FIGS. 10A-10C show a third embodiment of the invention, illustrating a process of manufacturing a wiring substrate according to the invention.

First, a substrate 8' is provided on the upper and lower insulative layers 8a thereof with a multiplicity of stacked pairs of parallel signal transmission lines 1a and 1b respectively, facing each other as shown in FIG. 10A. Provided at the terminal sections of the respective signal transmission lines 1a and 1b are a pad electrode 1e and a contact electrode 1f such that they do not face each other. In addition, a pad electrode 1h is provided on the insulative layer 8a connected with the contact electrode 1f of the signal transmission line 1b through a via hole formed in the insulative layer 8a.

The substrate 8' is fabricated as follows. First, a B stage substrate, called prepreg, is formed by impregnating a glass fiber fabric in a pre-hardened epoxy resin for example having ordinary dielectric loss tangent $\delta$. Second, the B stage substrate is applied thereonto from the upper and lower sides with thin copper films, and hardened to form a copper plated multi-layer plate. Third, the copper films of the multi-layer plate is patterned by a photolithography technique to define required paired transmission lines. Finally, via holes are formed in the substrate 8', through which conductive paths are formed connecting the respective contact electrodes 1f and the pad electrodes 1h. In an event where the wiring substrate 8 has a multi-layer structure, the multi-layers are stacked interposed with prepregs in between the neighboring layers, with the substrate 8' serving as the uppermost layer. These layers are heated under a pressure. Such multi-layer structure may be employed equally well in other inventive substrates.

Figure 10B:
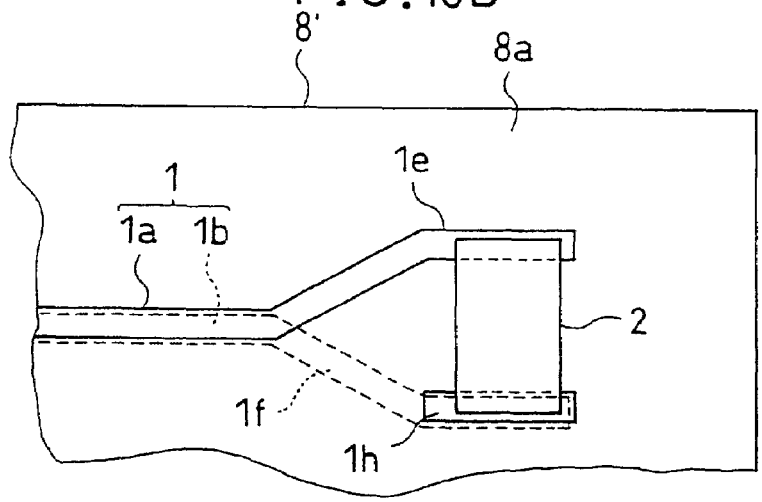
Figure 10C:
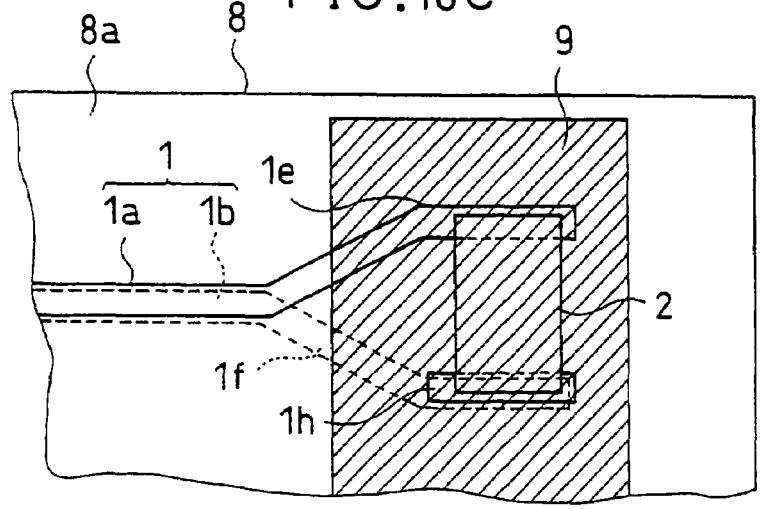

Next, a terminal resistor 2 is placed between the terminal ends of the respective paired transmission lines 1, i.e. between the pad electrodes 1e and 1h, as shown in FIG. 10B. The wiring electrodes of the terminal resistor are connected with the corresponding pad electrodes 1e and 1h by flip chip bonding. Although any ordinary, chip resistor can be used as the terminal resistor 2, it is preferred to use a chip resistor of the invention as shown in FIG. 9C, which resistor has a pair of metallic electrodes 24 formed on the resistive film 22 deposited on a glass substrate 21 containing a modified cation additive and hence having a large dielectric loss tangent $\delta$.

Next, glass powder (having a preferred particle size of about 10 micrometers) containing a modified ionized cation additive is subjected to a silane coupling treatment in which the glass power is impregnated with a silane coupling agent solution, and then dried. The glass plate preferably contains as much oxides of ionic elements such as sodium (Na), potassium (K), strontium (St), calcium (Ca), magnesium (Mg), barium (Ba), as possible. The more oxides it contains, the more enhanced ionic bonding it has, so that the dielectric loss tangent $\delta$ of the plate increase. Ordinary glasses including plate glass, bottle glass, and press glass are all satisfactory candidates for the purpose of the invention.

60-80% by weight of this glass powder and about 20% by weight of bisphenol F type epoxy resin (primer) which contains a little amount of epoxy bromide (Br), plus additives including a phenol hardener, a reactive diluent, a plasticizer such as vinyl acetate or a dimer acid, are mixed together in a screw mixer to form a sticky fluid organic potting resin 9 having a large dielectric loss tangent δ. Epoxy bromide (Br) contains liberated, ion-bonded bromine atoms, so that the overall ion bonds in the resin will be increased accordingly, thereby providing enhanced dielectric loss tangent δ.

In potting the substrate 8', the sticky fluid organic potting resin 9 is dropped onto the terminal resistor 2 and in the vicinity thereof by means of a fluid dispenser and then hardened to produce a insulator coated structure.

The potting and heating of the substrate 8' in the epoxy resin can be carried out simultaneously for all the paired transmission lines 1 (e.g. 64 pairs for 64-bit system) provided on the wiring substrate 8'. The surfaces of the transmission lines are covered with a protective solder resist film for example.

An alternative thermosetting organic potting resin 9 is a thermosetting organic material containing a hydroxyl radical. It is recalled that thermosetting polymers such as epoxy resin hardens through chemical reactions after it is cast, developing a 3-dimensional mesh structure. Of the thermosetting polymers, those which contain hydroxyl (OH) radicals have sufficiently large polarizability (and hence large dielectric constant) and large dielectric loss tangent δ above 1 GHz ($10^9$ Hz). Hence, they can be used as the substrate of the invention.

Sticky fluid organic potting resins 9 mixed with the above described glass powder and the thermosetting organic material containing hydroxyl radicals are also preferable.

Figure 11A:
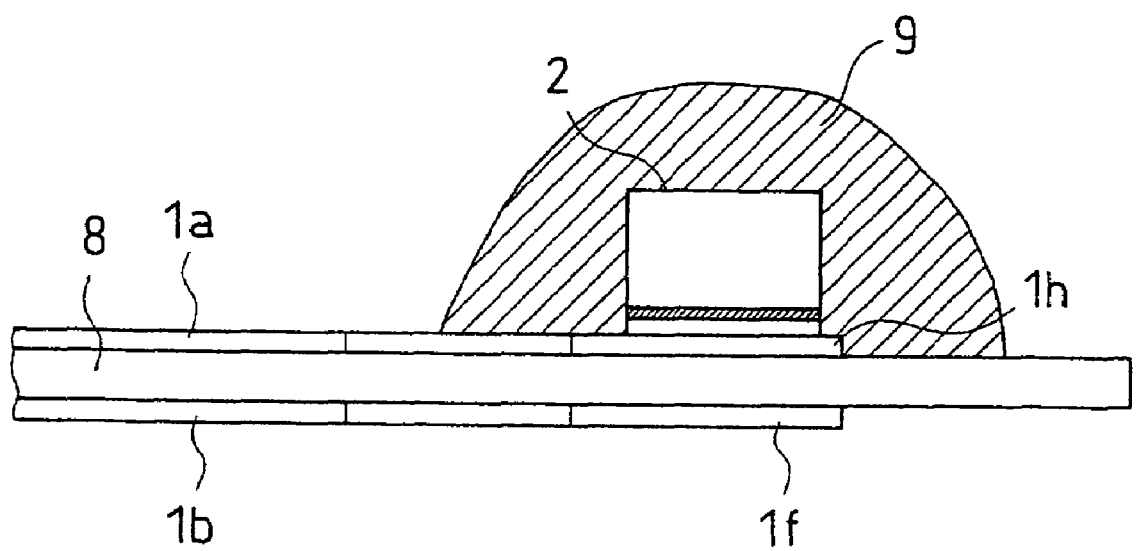
FIGS. 11A-11B show a wiring substrate produced by the process of FIGS. 10A-10C.
Figure 11B:
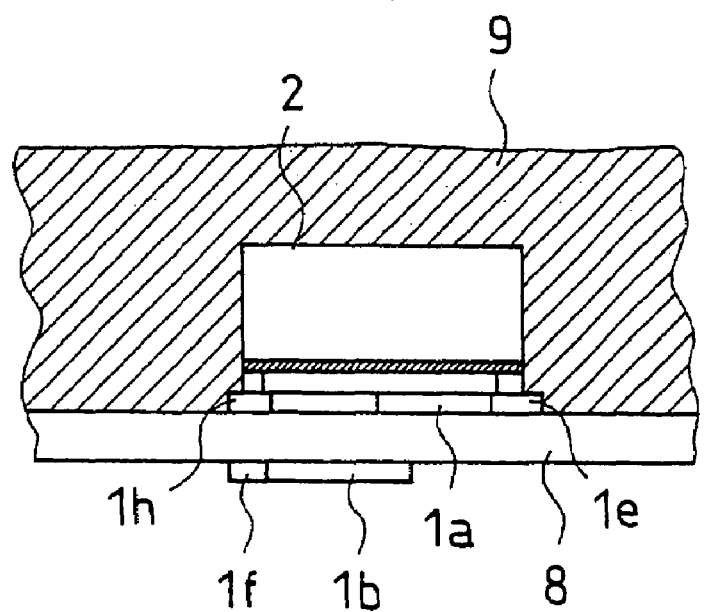

FIG. 11 schematically shows a coated terminal resistors 2 of the invention. In particular, FIGS. 11A and 11B show cross sections of a terminal resistor 2 mounted on the wiring substrate 8 as viewed from one side thereof and from the terminal end thereof, respectively.

Thus, in accordance with this embodiment, a terminal resistor 2 connected with the terminal ends of paired transmission lines can be coated by potting them with a sticky fluid organic potting resin 9 mixed with glass powder having large dielectric loss tangent δ, or mixed with thermosetting organic material containing hydroxyl radicals, and then hardened. Because of this coating, energy of the high frequency components of the digital pulse signals and of the apparent transition pulses entering the chip resistor 2 can be absorbed as the power loss P by the dissipative insulator. Thus, through the reduction of the resonating energy of the parasitic inductance L1 and the parasitic capacitance C1 of the chip resistor 2, distortions of the pulse signals on the paired transmission lines 1 are minimized.

The terminal resistor 2 itself can be a chip resistor of FIG. 9C to further reduce the distortions of a digital pulse signal on the paired transmission lines 1.

Referring to FIGS. 12A and 12B, a fourth embodiment of the invention will now be described. This embodiment is concerned with a wiring substrate and the method of its manufacture.

In this embodiment, a wiring substrate is formed in a manner similar to the third embodiment described in connection with FIGS. 10A-11B. The only difference is that in the fourth embodiment the terminal sections of the paired transmission lines 1 associated with a terminal resistor 2 are included in the vicinity of the terminal resistor 2 where a dissipative potting resin is applied thereto, with the potting resin being a sticky fluid organic potting resin 9 mixed with glass having a large dielectric loss tangent δ or a thermosetting organic material containing a hydroxyl radical.

In this embodiment, the terminal sections of the paired transmission lines 1 are covered with the organic potting resin 9 of substantially the same thickness in place of a solder resist. In order to reduce the change in characteristic impedance in the intermediate region of the paired transmission lines 1, the potting resin 9 preferably has a large dielectric loss angle δ close to that of the insulator along the intermediate sections. This is also the case with other embodiments.

By coating together the terminal chip resistor 2 and the terminal sections of the transmission lines 1 connected with the chip resistor 2 with the potting resin 9, energy of the high frequency components of a digital signal and of the associated apparent transition pulse is absorbed as the power loss P by the dissipative insulator before they enter the chip resistor 2. Thus, through further reduction of the resonating energy of the parasitic inductance L1 and the parasitic capacitance C1 of the chip resistor 2, distortions of the pulse signals on the paired transmission lines 1 are further minimized.

The terminal sections of the paired transmission lines 1 to be coated with the organic resin are the sections extending from the very ends of the lines to the points slightly ahead of the nearest branches 4 as shown in FIG. 12. The lost capacitance for the sections relative to the ground (paired lines) amounts to conductance Gf. In addition, the lost capacity in the terminal resistor 2 contributes to the conductance Gf. The entirety of the conductance determines a lost current I.

Thus, it would be appreciated that in a digital pulse system utilizing such paired transmission lines 1, high frequency components of a digital signal and of the associated apparent transition pulse will not be affected at all by the coat of the dissipative insulator, so that these signals will be securely transmitted on the paired transmission lines and can be fully utilized.

Figure 13A:
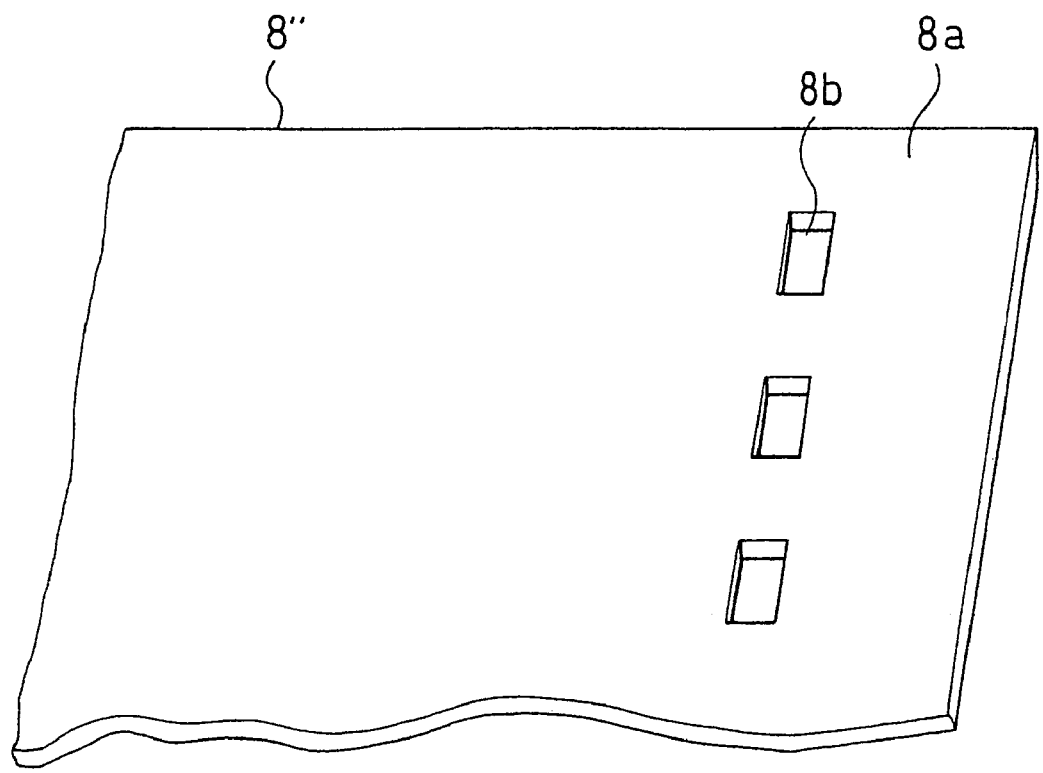
FIGS. 13A-13C show a fifth embodiment of the invention, illustrating a partial structure of a further wiring substrate manufactured by a further inventive method.
Figure 13B:
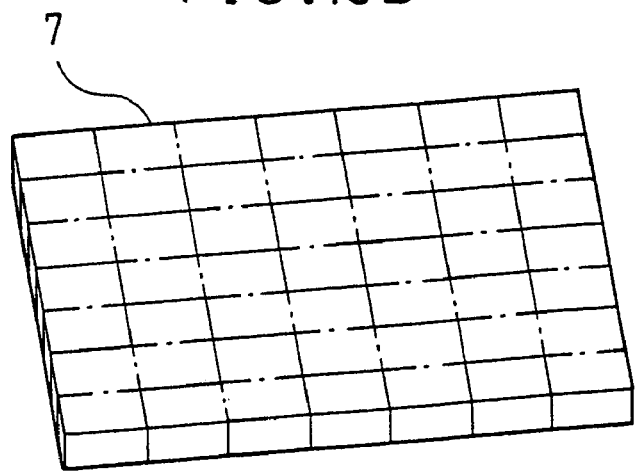
Figure 13C:
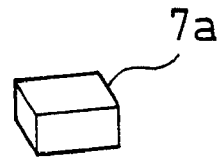

Referring to FIGS. 13A-13C, a fifth embodiment of the invention will now be described. This embodiment is concerned with a wiring-substrate and the method of its manufacture.

First, a B stage prepreg substrate 8" is prepared by impregnating a fiber glass fabric in a pre-hardened epoxy resin having ordinary dielectric loss tangent δ, as shown in FIG. 13A.

Next, the B stage substrate 8" is punched to form a required number of holes 8b at predetermined locations of the substrate, the holes having a predetermined size which is adequate to receiving therein a terminal resistor 2.

On the other hand, glass powder (preferably having a particle size of about 10 micrometers) containing a modified ionized cation additive is impregnated with a silane coupling agent solution, and then subjected to a silane coupling treatment before it is dried. The glass plate preferably contains as much oxides of ionic elements such as sodium (Na), potassium (K), strontium (St), calcium (Ca), magnesium (Mg), barium (Ba), as possible. The more oxides it contains, the more ionic influence it has on the dielectric loss tangent δ of the glass plate. Ordinary glasses including plate glass, bottle glass, and press glass are all satisfactory for the purpose of the invention.

60-80% by weight of this glass powder and about 20% by weight of epoxy novolac resin (primer) which contains a little amount of epoxy bromide (Br), plus additives including a phenol hardener, a hardening accelerator such as an amine, a plasticizer such as vinyl acetate or a dimer acid, are mixed together in a screw mixer. The resultant mixture is extruded from an extruder together with a glass fiber fabric to impregnate the fiber, thereby forming a slab of dissipative resin. The slab now contains the glass powder having a large dielectric loss tangent δ. This is a pre-hardened thermosetting substrate 7 as shown in FIG. 13B, called prepreg. The dielectric loss angle δ of the thermosetting substrate 7 is larger than those of ordinary B stage substrates at least in the frequency region of a digital signal transmitted.

Next, the pre-hardened thermosetting substrate 7 containing glass powder having large dielectric loss tangent δ is diced into individual embedding substrate members 7a that fit in the respective holes 8b formed in the ordinary substrate 8″ made of an ordinary insulator. This can be done by cutting the substrate 7 in the longitudinal and transverse directions as indicated by dotted lines in FIG. 13B.

These embedding substrate members 7a are embedded in turn in the respective holes 8b of the substrate 8″. These embedding substrates 8″ may be glued in the holes for temporarily securing them in position. In this way, a pre-hardened thermosetting mixed insulation type substrate is formed, in which pre-hardened embedding substrate members 7a containing glass powder having a large dielectric loss tangent δ are disposed in the regions of ordinary prehardened thermosetting substrate 8″ where individual terminal resistors 2 will be mounted.

The wiring substrate of the invention is completed through a process of forming stacked pairs of transmission lines, contact electrodes, and pad electrodes on the upper and the lower surfaces of the mixed insulation type substrate, and a subsequent process of arranging terminal resistors and bonding the wiring electrodes of the terminal resistors to the associated pal electrodes by flip chip bonding technique. These processes are carried out in the same manner as described in the third embodiment with reference to FIGS. 10A-11B. Hence, details of the processes will not be repeated here.

It is noted that an organic thermosetting material that contains a hydroxyl radical can be replaced by a pre-hardened thermosetting substrate having a large dielectric loss tangent δ. It is recalled that thermosetting polymers such as epoxy resin harden through chemical reactions after they are applied, developing a 3-dimensional mesh structure. Of the thermosetting polymers, those which contain hydroxyl (OH) radicals have sufficiently high polarizability (and hence high dielectric constant) and a large dielectric loss tangent δ above 1 GHz ($10^9$ Hz). Hence, they are suitable material for the substrate of the invention.

A mixture of the pre-hardened thermosetting substrate 7, including glass powder which contains modified ionized additive and the pre-hardened thermosetting organic material containing hydroxyl radicals is a more preferable resin.

As described above, in this embodiment, a pre-hardened thermosetting insulative substrate 8a is provided at predetermined positions thereof with holes 8b having a predetermined size on one hand. On the other hand, pre-hardened thermosetting insulative slab member 7 having a larger dielectric loss angled than that of the substrate 8a is formed. The slab member 7 is then cut into individual embedding members which fit in the corresponding holes 8b of the substrate 8a. By embedding and then heating the embedding members 7a in the respective holes 8b, a mixed insulation type substrate is obtained which has predetermined regions having a dielectric loss angle larger than the rest regions of the substrate at least in the frequency region of digital signals transmitted by the transmission lines. Thereafter, terminal sections of the paired transmission lines are disposed in the predetermined regions where dielectric loss angle is made larger. Subsequent process can be carried out by ordinary manufacturing processes. This provides an mixed insulation type wiring substrate which has significantly enhanced dissipative regions for terminal resistors.

It is noted that in this wiring substrate, the significantly dissipative substrate is provided only in the regions where the terminal resistors 2 are located, so that high frequency components of digital signals and of the apparent transition pulses are absorbed significantly only in these regions without harming the pulse transmissions by the transmission lines. Thus, the energy which could resonate parasitic inductance L1 and parasitic capacitance C1 of each chip resistor 2 is further decreased. Consequently, the lost capacitance of the transmission lines in the enhanced dissipative substrate region relative to that of the ground (paired lines beyond the dissipative region) results in an additional conductance Gf of the region, providing an additional current to the resistor. Accordingly, digital pulse signals will have less distortions on the paired transmission lines 1.

The process of adding a insulator-coated structure to the terminal sections as described in connection with the third embodiment shown in FIGS. 10A-11B may be used in the present embodiment of the invention. This can be done by dropping and potting a sticky fluid organic potting resin 9 mixed with glass powder having large dielectric loss tangent δ onto the terminal resistor 2 and in the vicinity thereof by means of fluid dispenser, and hardening the coated sections.

It will be appreciate that by making the terminal resistor 2 itself to be a chip resistor of FIG. 9C, the distortions of a digital pulse signal on the paired transmission lines 1 will be further reduced.

The process of coating and hardening the coated portions of the terminal sections of the paired transmission lines together with the terminal resistor 2 and the vicinity thereof with a sticky fluid organic potting resin 9 mixed with glass powder having a large dielectric loss tangent δ may be further added to the present embodiment, as in the fourth embodiment shown in FIGS. 12A and 12B.

Thus, in this embodiment also the energy that could resonate the parasitic inductance L1 and the parasitic capacitance C1 of the chip resistor 2 is further decreased to minimize distortions of the pulse.

Figure 14A:
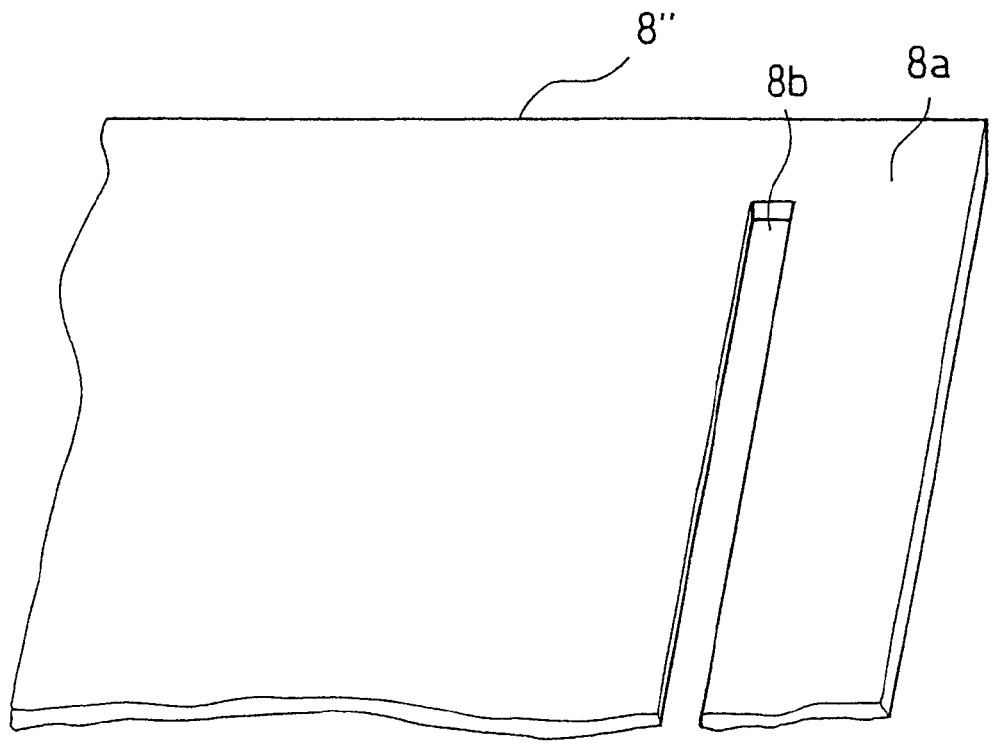
FIGS. 14A-14C show a sixth embodiment of the invention, illustrating a partial structure of a still further wiring substrate manufactured by a still further method according to the invention.
Figure 14B:
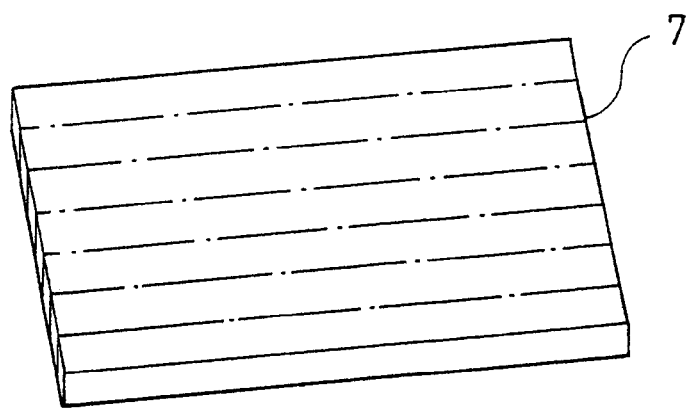
Figure 14C:
Figure 15A:
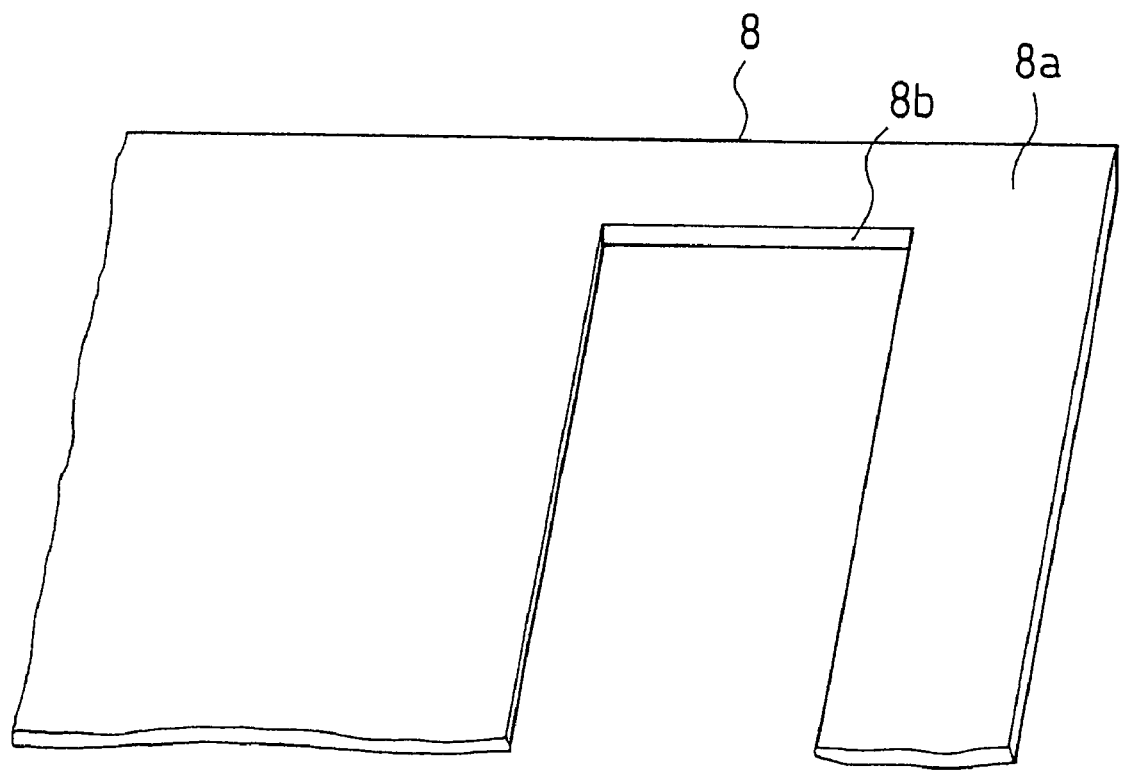
FIGS. 15A-15B show modifications of the wiring substrate shown in FIG. 14.
Figure 15B:
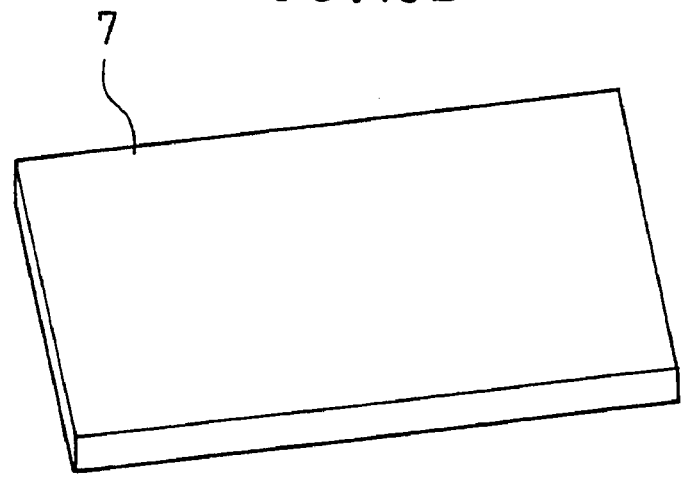

Referring to FIGS. 14A-14C, a sixth embodiment of the invention will now be described. This embodiment is concerned with a wiring substrate and a method of its manufacture.

This embodiment differs from the fifth embodiment as follows. In this embodiment an elongate hole 8b is formed for the entire paired transmission lines 1 as shown in FIG. 14A, in contrast to the individually formed holes 8b in the foregoing embodiment shown in FIG. 13A.

The pre-hardened thermosetting substrate 7 mixed with glass powder having large dielectric loss tangent δ is cut in the longitudinal direction as indicated by dotted lines in FIG. 14B to make an elongate embedding substrates 7a that fit in the respective holes 8b formed in the substrate 8″.

These embedding substrate members 7a are embedded in turn in the respective holes 8b of the substrate 8″, and secured temporarily by glue as needed.

In this process, the embedding substrate 7a may be made larger in width in the longitudinal direction of the paired transmission lines so as to extend over not only the terminal resistor but also the vicinity of the resistor and the terminal sections of the paired transmission lines. The terminal sections of the paired transmission lines 1 to be covered by the embedding member 7a are the sections extending from the very ends of the lines to the points slightly ahead of the nearest branch.

Thus, a mixed insulation type substrate can be obtained by the placement of pre-hardened embedding substrate 7a over the regions of the ordinary pre-hardened substrate 8″ covering the entire terminal sections of the paired transmission lines 1 and for the terminal resistors 2. It is noted that the elongate wider embedding substrate 7a poses no problem in the transmission of pulse signals, since the substrate does not extend beyond the terminal sections of the paired transmission lines transmitting the pulse signals.

The sixth embodiment has a feature that it provides the same effects as the fifth embodiment while using a simplified embedding substrates 7a and an ordinary substrate 8". This implies that manufacture of such mixed insulation type substrates is easier.

It would be understood that magnetic materials may be used in place of the dielectric materials described above.

If magnetic materials are used, the power loss is given in terms of magnetic loss angle δ' defined by formula (1') below, which is similar to Equation (1);

$$\tan \delta' = \mu''/\mu' \qquad (1')$$

where μ' and μ'' are the real and imaginary parts of the complex permeability, and tan δ' is the magnetic loss tangent of the material.

Since the parasitic reactance (due to parasitic capacitor C and parasitic inductance L) and resistance R of a terminal resistor are contained in the resistor in a physically inseparable form, the permeability affects the current passing through the parasitic capacitor C, parasitic inductance L, and resistance R, so that the resultant current I is affected by the reactance. Specifically, the resultant current I is decreased or lost by a factor ωμ''/μo (=ωμr tan δ').

Given the input current I and the impressed voltage Vo, the current lost by the resultant impedance Z is given by Iloss=ωμr tan δ'Vo/Z. The power loss P' is given by the product of the lost current Iloss and the impressed voltage Vo, which amounts to ωμr tan δ'(Vo)²/Z, where ω is the angular frequency and μr is the permeability.

Thus, the power loss P' increases with the magnetic loss angle δ' and permeability μr, and with the angular frequency ω. Consequently, the energy of most high frequency components of a pulse and of the apparent transitional wave is absorbed by the insulator as the power loss P', which increases with the angular frequency ω.

However, since the reflectivity disadvantageously increases with permeability, the best compromise is a choice of a magnetic material having largest possible magnetic loss angled δ' but not too great permeability. That is, materials that exhibit ferri-magnetic resonance are preferable. For example, this type of magnetic materials include Ni—Zn ferrite, Ni—Al ferrite, Li—Fe ferrite, Garnet ($R_3Fe_5O_{12}$; R=Mg, Ni, or Y) ferrite, and Co—Cu ferrite. A Ni—Cu ferrite with its Ni partly substituted for by Co, Cu, Mg, Mn, and Fe is also acceptable.

In one example, a magnetic material chosen from those mentioned above is preferably powdered to minute particles and embedded in an organic material.

Powder of such magnetic material can alternatively be used as the glass powder in the foregoing embodiments. Yet the same effects can be obtained from the magnetic material. Since these magnetic materials can be used in the same manner as the glass powder as described in the foregoing embodiments, further description of the use of magnetic materials will be omitted.

What we claim is:

1. A method of manufacturing a wiring substrate, comprising steps of:
    preparing an insulative substrate having thereon a stacked pair of parallel transmission lines;
    mounting and connecting a terminal chip resistor with the terminal ends of said stacked pair of parallel transmission lines, said terminal chip resistor having a resistance that matches the characteristic impedance of said stacked pair of parallel transmission lines to minimize the reflection of waves in said stacked pair of parallel transmission lines;
    preparing a sticky organic potting resin solution having a larger dielectric loss angle than said insulative substrate at least in the frequency range of digital signals to be transmitted by said stacked pair of parallel transmission lines;
    dropping said sticky organic potting resin solution onto said terminal chip resistor and the vicinity thereof for potting; and
    hardening said organic potting resin;
    wherein said sticky organic potting resin solution includes a thermosetting organic material containing a hydroxyl radical.

* * * * *